US012811088B2

(12) United States Patent
Ito et al.

(10) Patent No.: US 12,811,088 B2
(45) Date of Patent: Nov. 24, 2026

(54) CHARGED PARTICLE BEAM DEVICE, AND BEAM DEFLECTION METHOD IN CHARGED PARTICLE BEAM DEVICE

(71) Applicant: Hitachi High-Tech Corporation, Tokyo (JP)

(72) Inventors: Naoto Ito, Tokyo (JP); Yu Yamazawa, Tokyo (JP); Tsunenori Nomaguchi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 278 days.

(21) Appl. No.: 18/720,952

(22) PCT Filed: Jan. 18, 2022

(86) PCT No.: PCT/JP2022/001554
§ 371 (c)(1),
(2) Date: Jun. 17, 2024

(87) PCT Pub. No.: WO2023/139631
PCT Pub. Date: Jul. 27, 2023

(65) Prior Publication Data

US 2025/0062096 A1 Feb. 20, 2025

(51) Int. Cl.
*H01J 37/147* (2006.01)
*H01J 37/10* (2006.01)
(Continued)

(52) U.S. Cl.
CPC .......... *H01J 37/1472* (2013.01); *H01J 37/10* (2013.01); *H01J 37/244* (2013.01); *H01J 37/28* (2013.01); *H01J 2237/2448* (2013.01)

(58) Field of Classification Search
CPC ........ H01J 37/00; H01J 37/02; H01J 37/1472; H01J 37/10; H01J 37/244; H01J 37/26;
(Continued)

(56) References Cited

U.S. PATENT DOCUMENTS 3,885,157 A * 5/1975 Heinemann ............. H01J 37/22 250/311
2006/0102838 A1* 5/2006 Nakasuji ............ G01N 23/2251 250/307
2023/0178328 A1* 6/2023 Wang .................. H01J 37/1474 250/396 R

FOREIGN PATENT DOCUMENTS

JP 2821153 B2 11/1998
WO WO-2020240861 A1 * 12/2020 .............. H01J 37/28

OTHER PUBLICATIONS

International Search Report (PCT/ISA/210) issued in PCT Application No. PCT/JP2022/001554 dated Mar. 8, 2022 with English translation (5 pages).

(Continued)

*Primary Examiner* — Jason L Mccormack
(74) *Attorney, Agent, or Firm* — Crowell & Moring LLP

(57) ABSTRACT

A degree of freedom in an arrangement position of an electric field deflector is improved and a chromatic aberration is prevented from occurring. A charged particle beam apparatus includes electric field deflectors and magnetic field deflectors. Each of the electric field deflectors is disposed on a plane different from a plane orthogonal to an optical axis of the beam on which the magnetic field deflectors are disposed. An integrated computer moves a deflection fulcrum, which is an intersection of a beam before deflection and the beam deflected by the electric field deflectors, by controlling deflection of the beam caused by the electric field deflectors and a deflection fulcrum, which is an intersection of the beam before deflection and the beam deflected by the magnetic field deflectors, by controlling deflection of the beam caused by the magnetic field deflectors, the deflection fulcrums being moved independently.

19 Claims, 14 Drawing Sheets

(51) Int. Cl.
*H01J 37/244* (2006.01)
*H01J 37/28* (2006.01)

(58) Field of Classification Search
CPC .......... H01J 37/28; H01J 37/05; H01J 37/147; H01J 37/153; H01J 2237/2448; H01J 2237/1508
USPC .......................................... 250/306, 307, 311
See application file for complete search history.

(56) References Cited

OTHER PUBLICATIONS

Japanese-language Written Opinion (PCT/ISA/237) issued in PCT Application No. PCT/JP2022/001554 dated Mar. 8, 2022 with English translation (5 pages).

* cited by examiner

[FIG. 1]
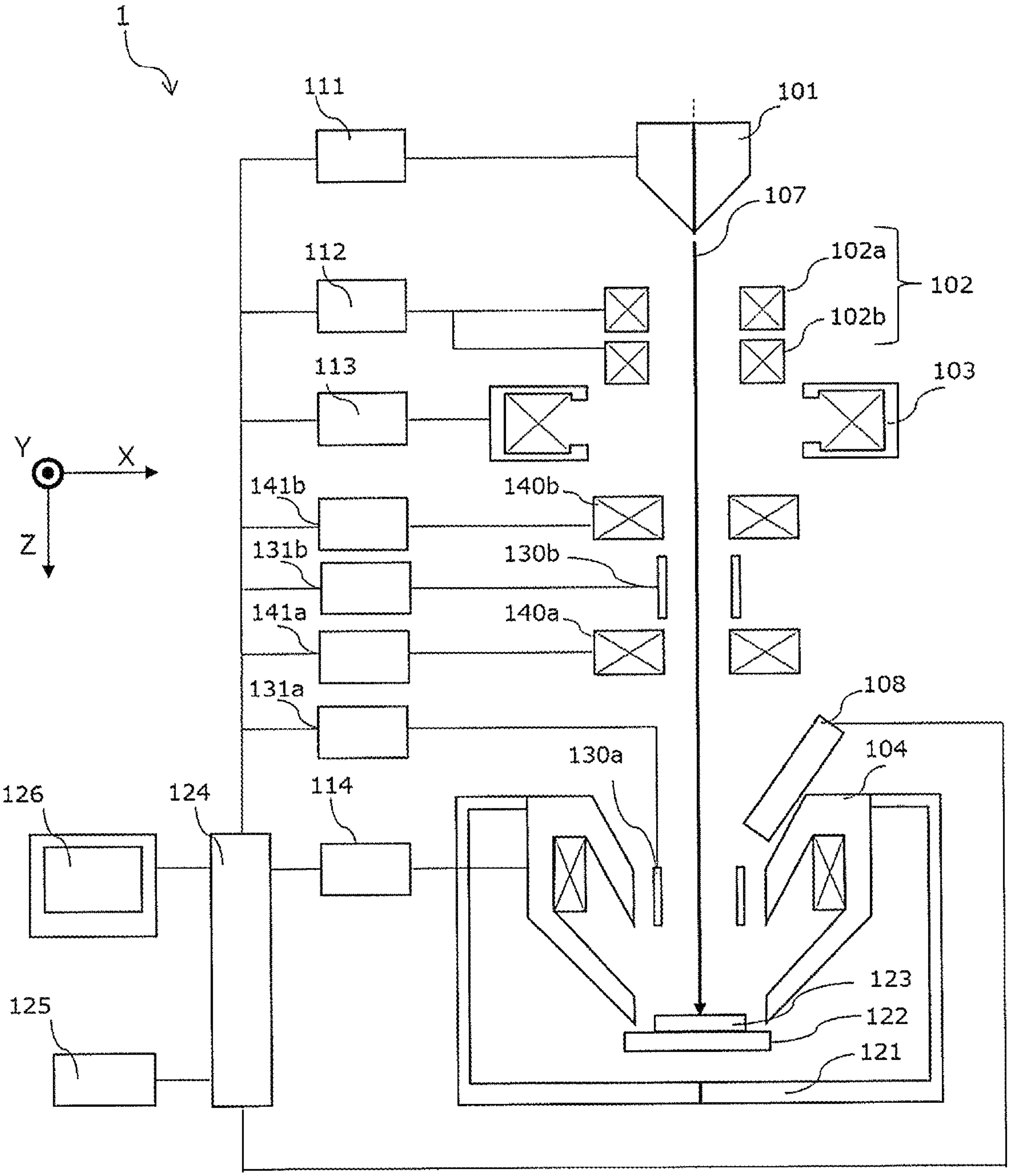

[FIG. 2]
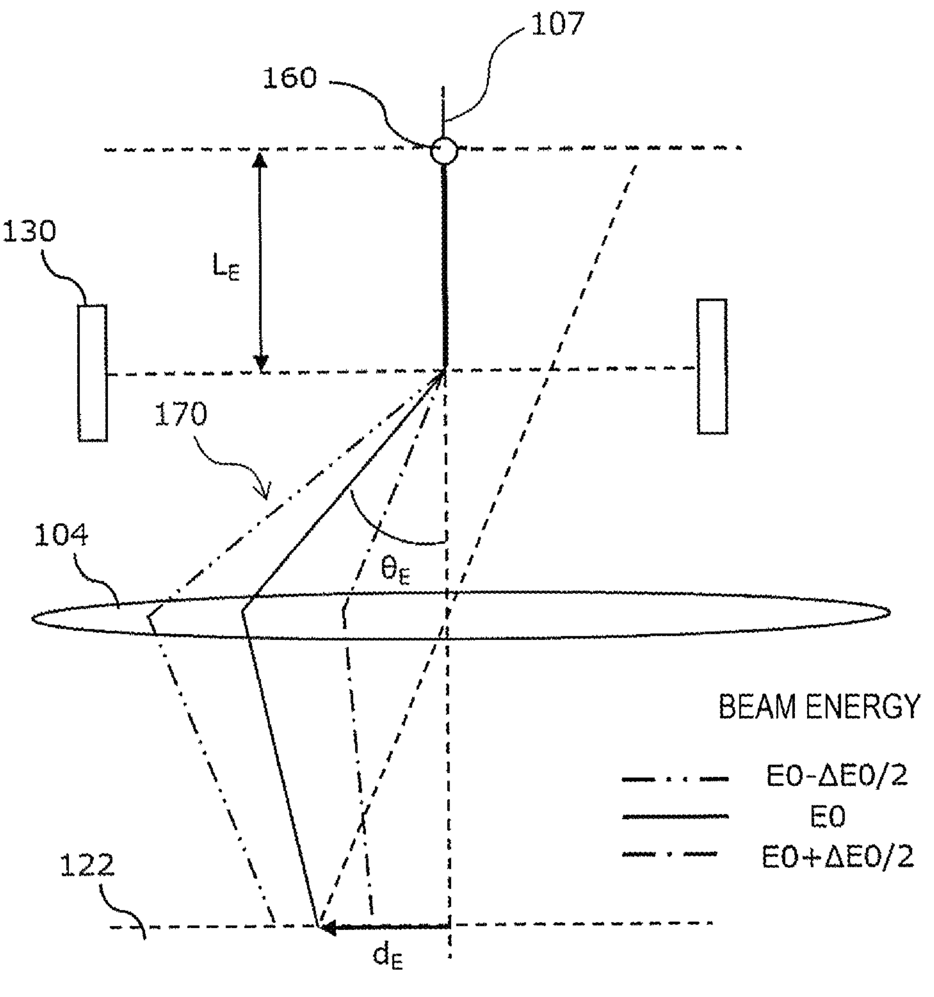

[FIG. 3]
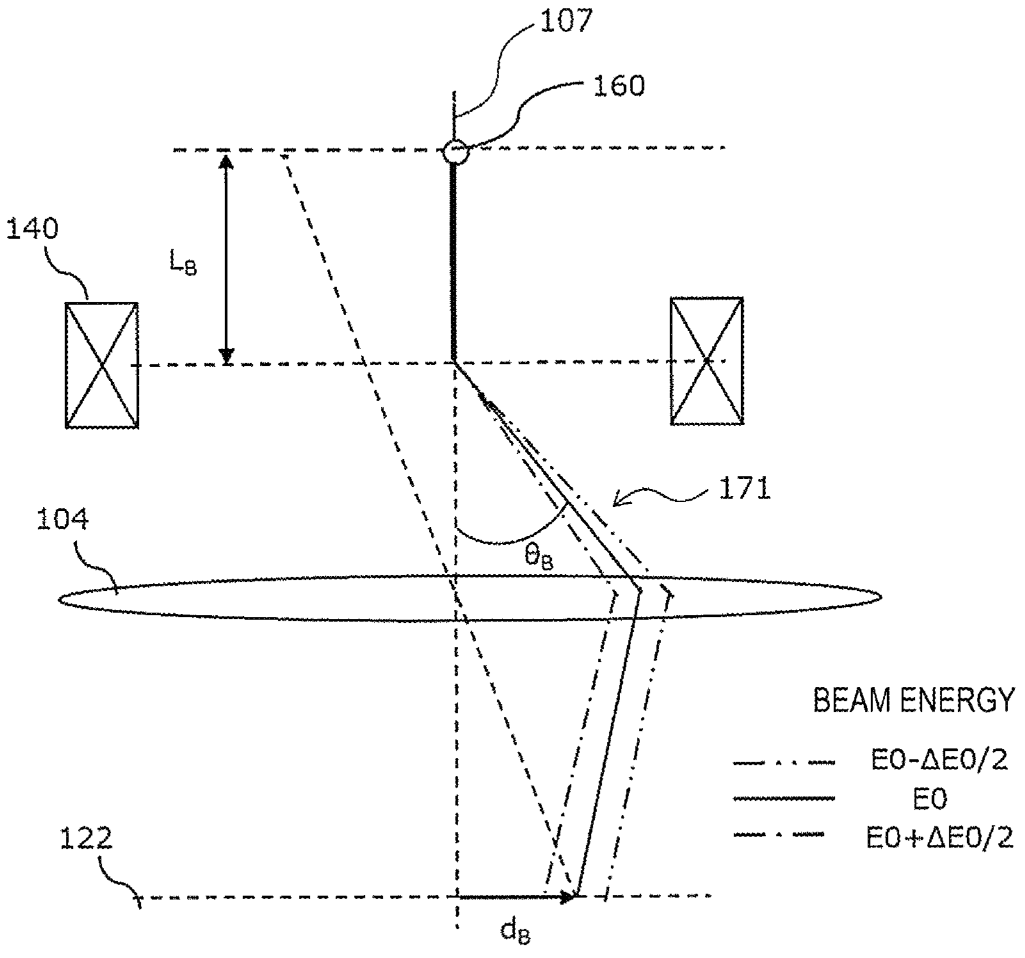

[FIG. 4]
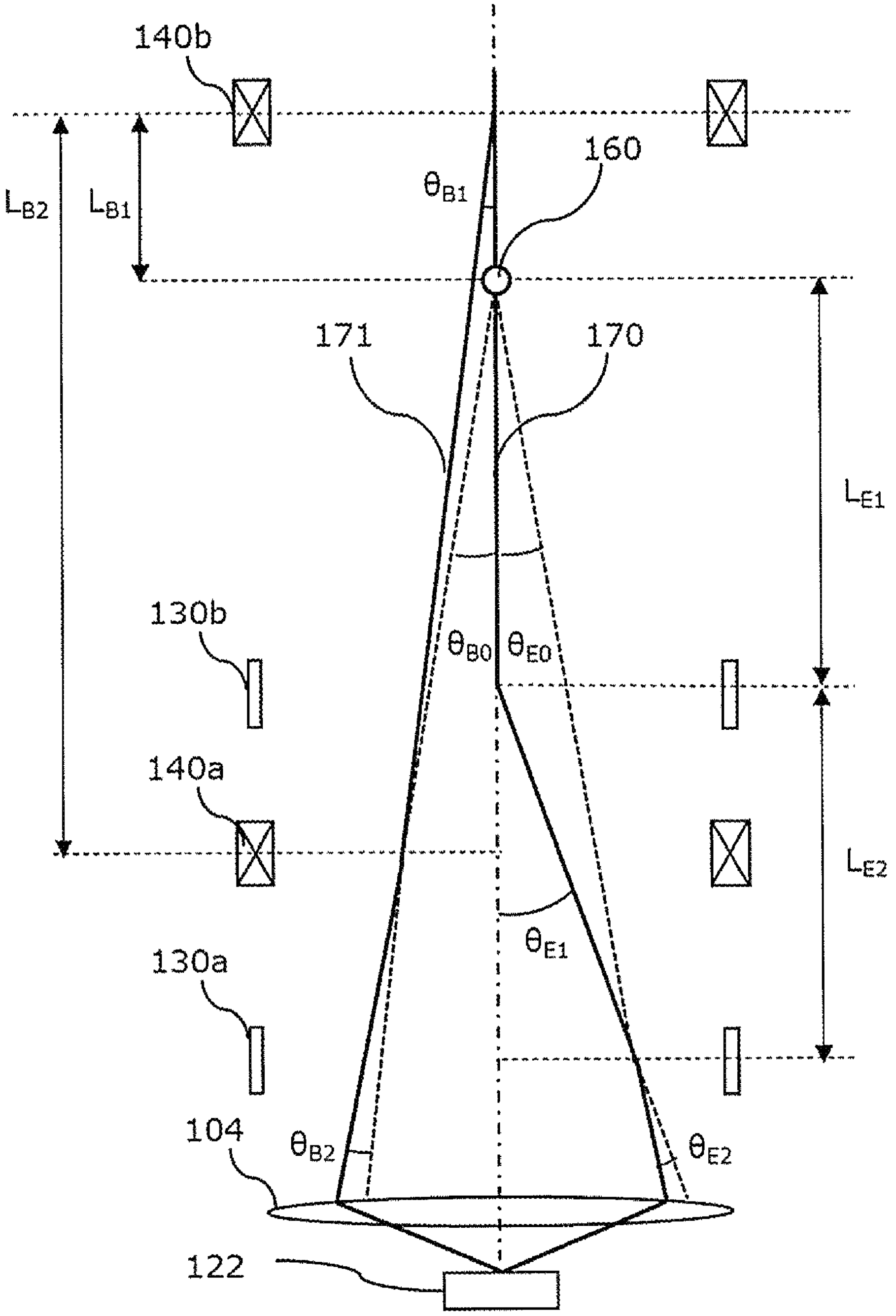

[FIG. 5]
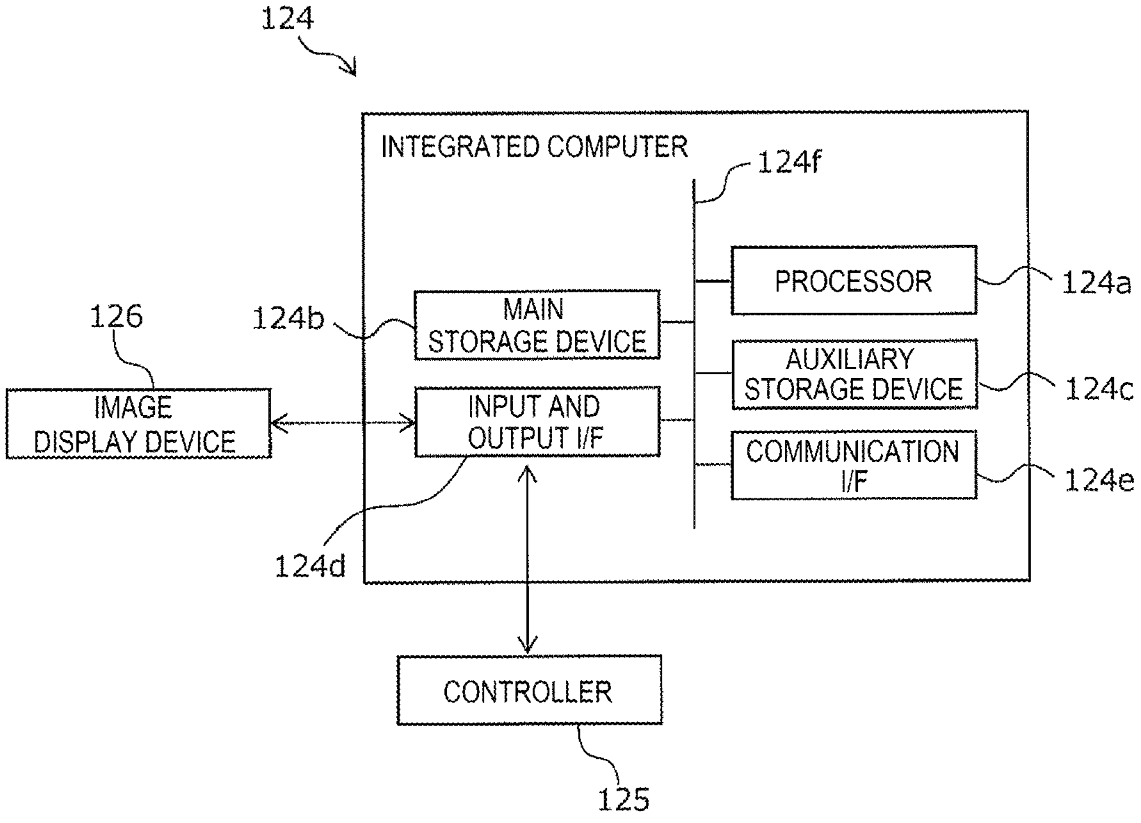

[FIG. 6]
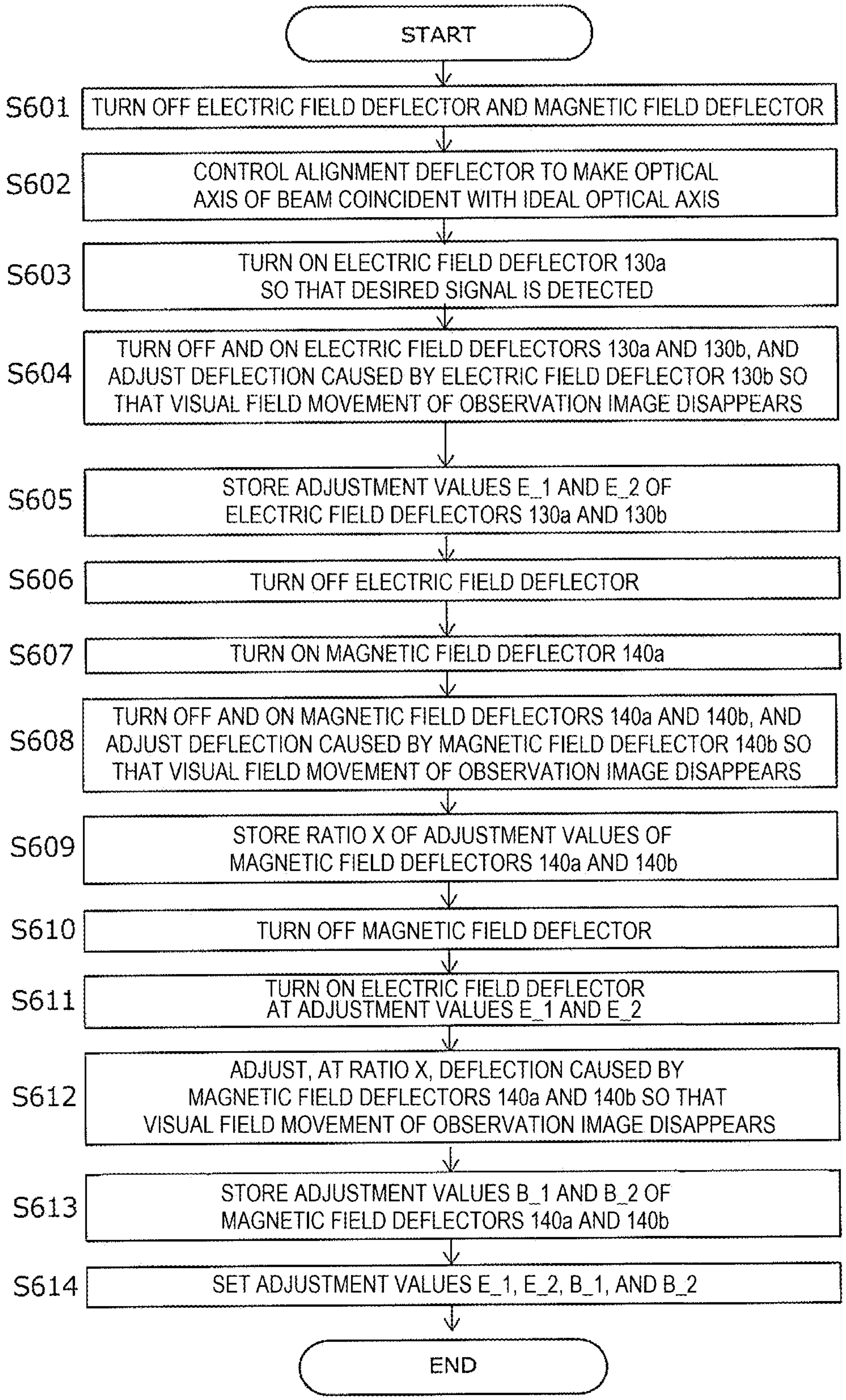

[FIG. 7]
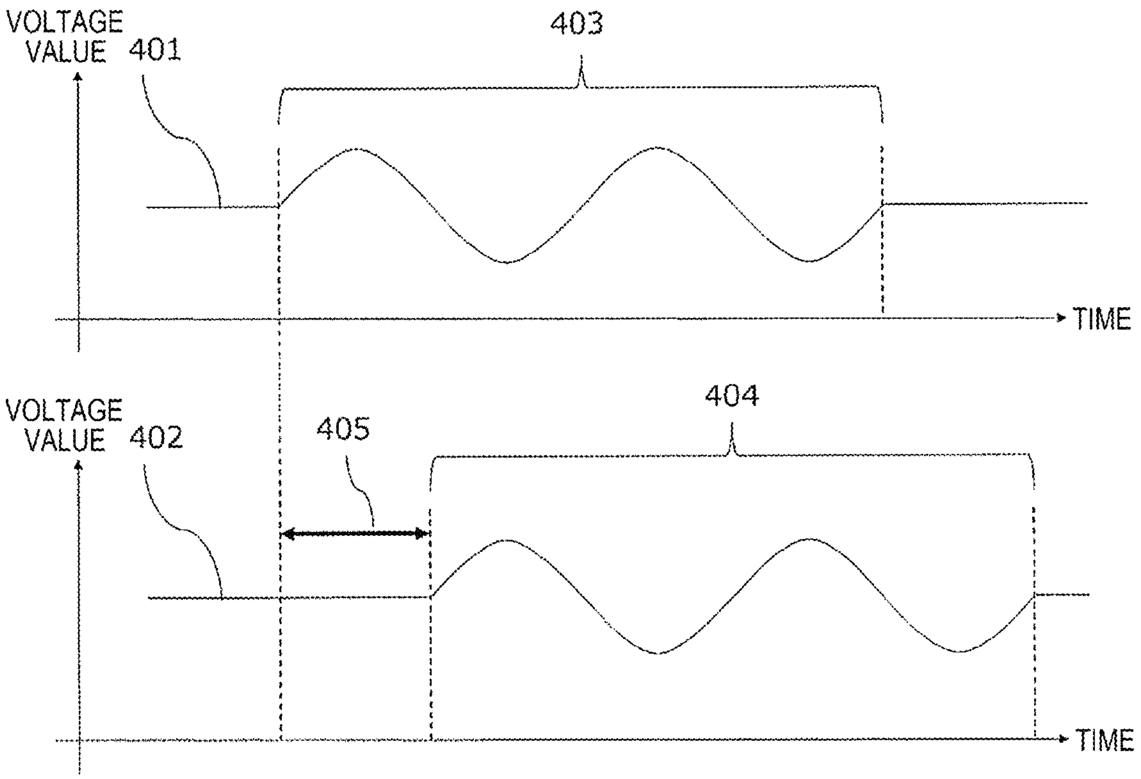

[FIG. 8]
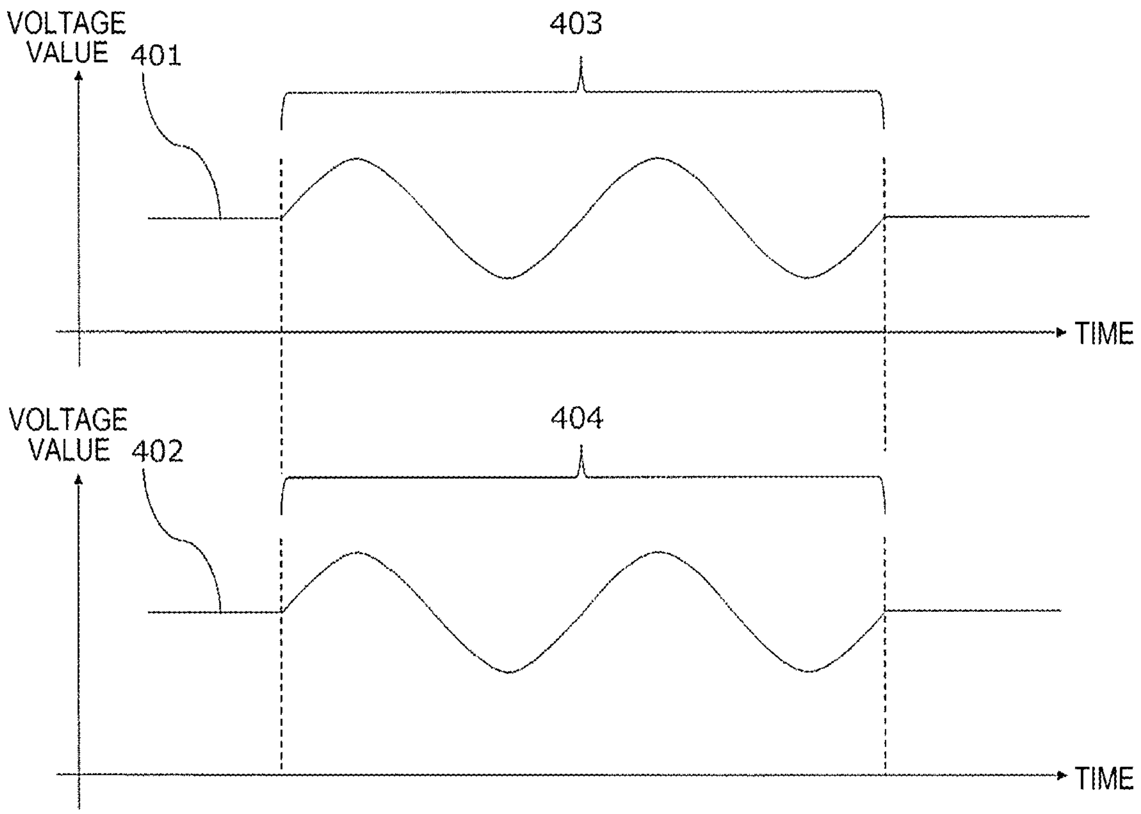

[FIG. 9]
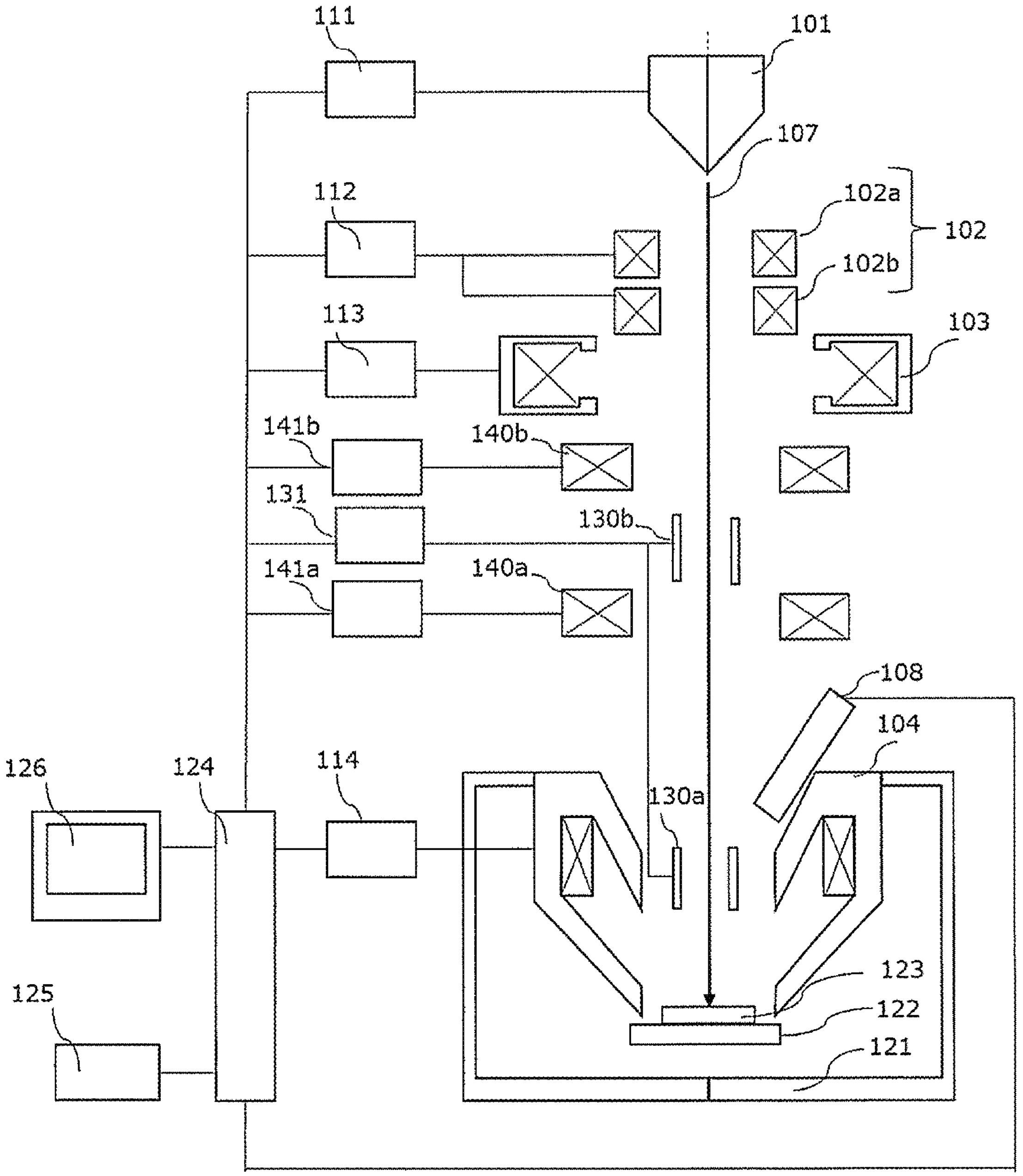

[FIG. 10]
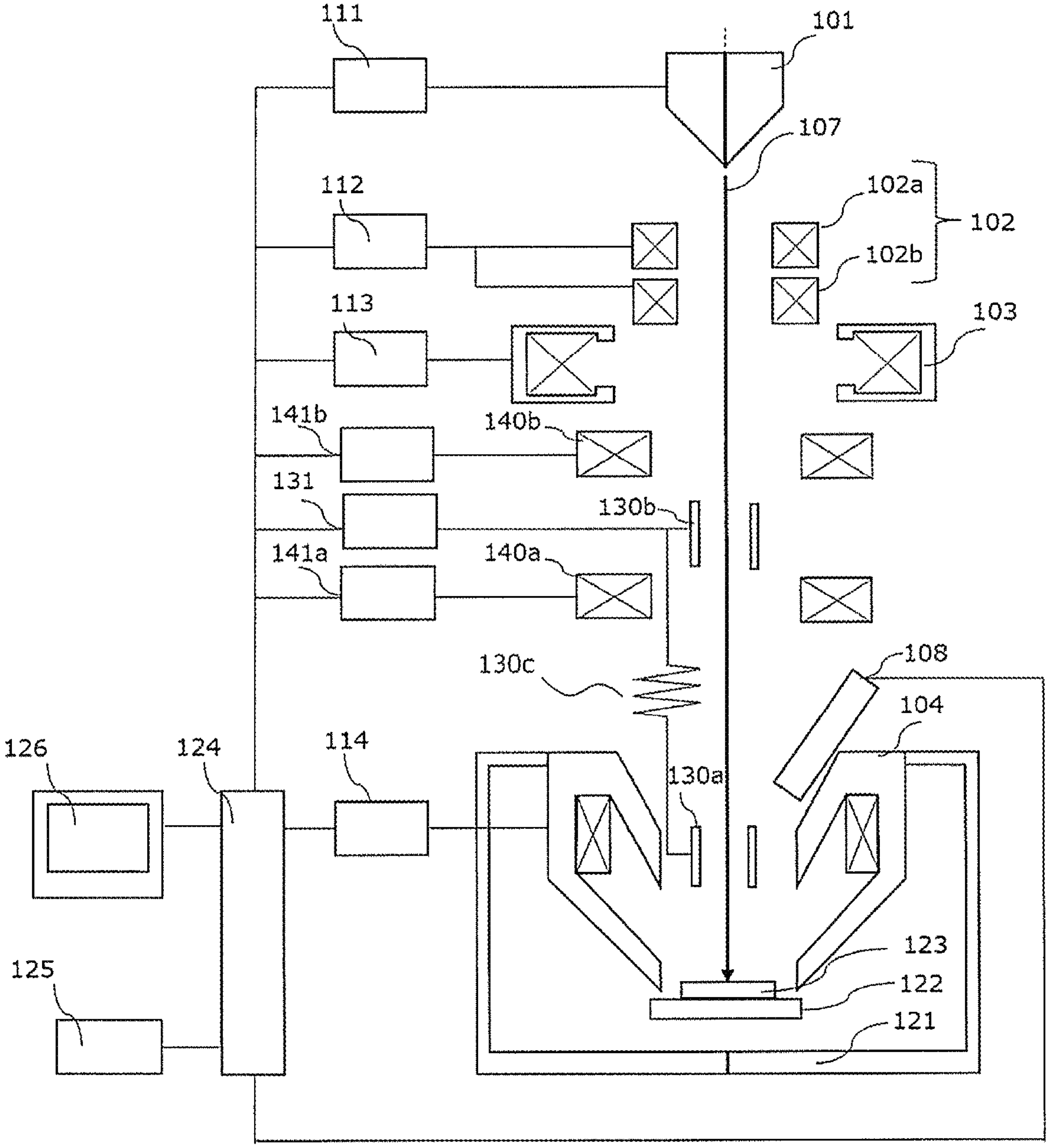

[FIG. 11]
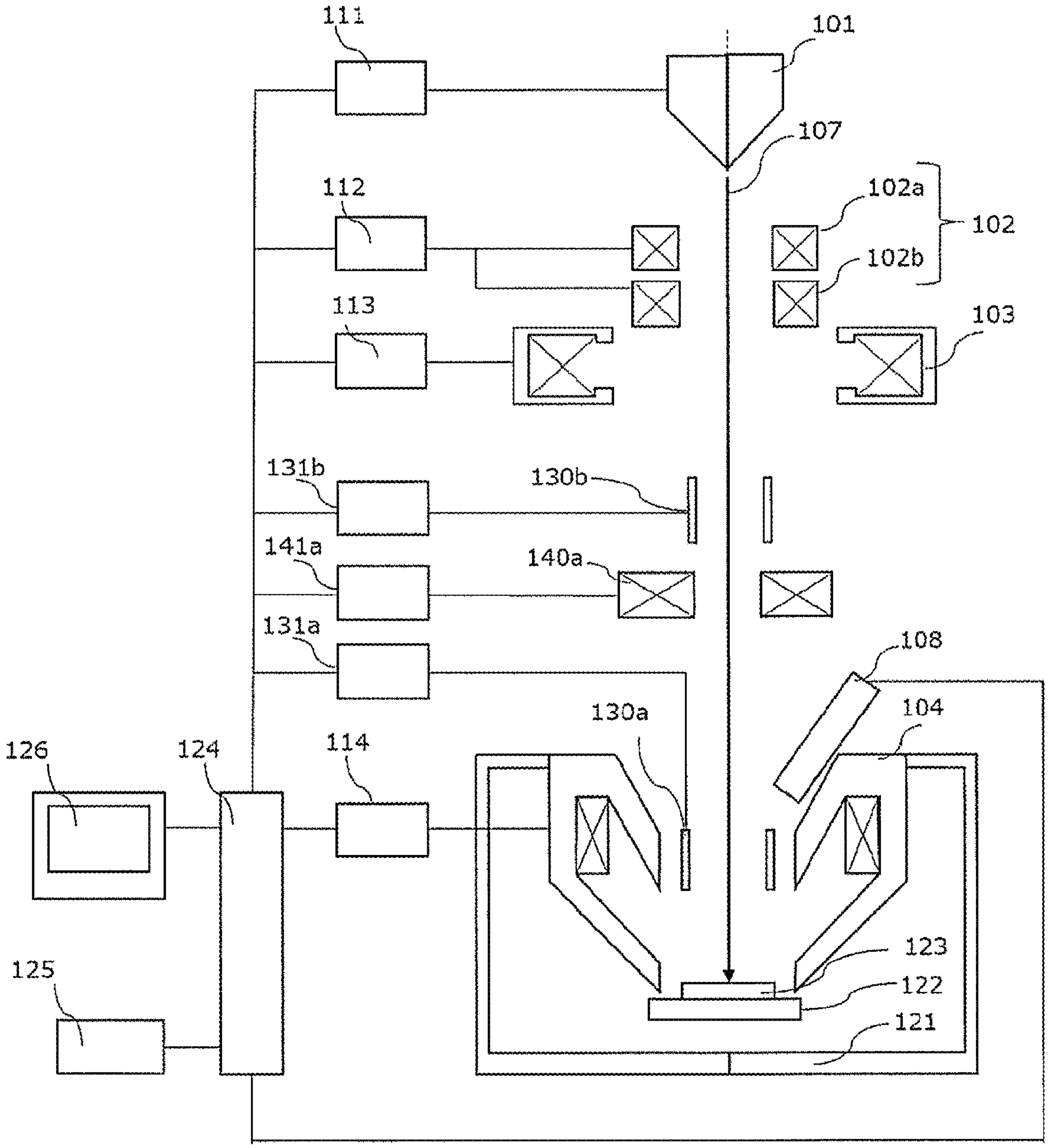

[FIG. 12]
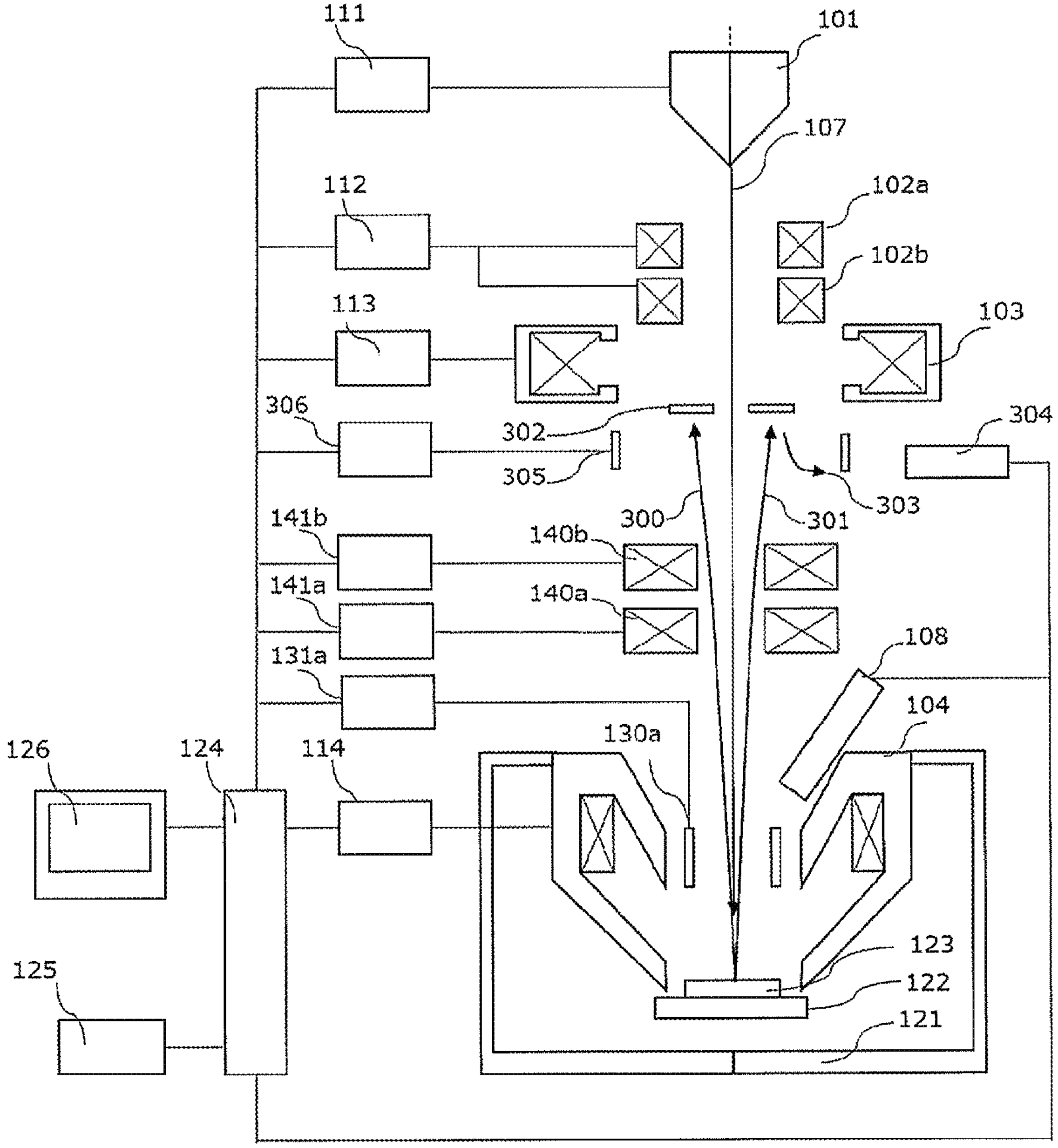

[FIG. 13]
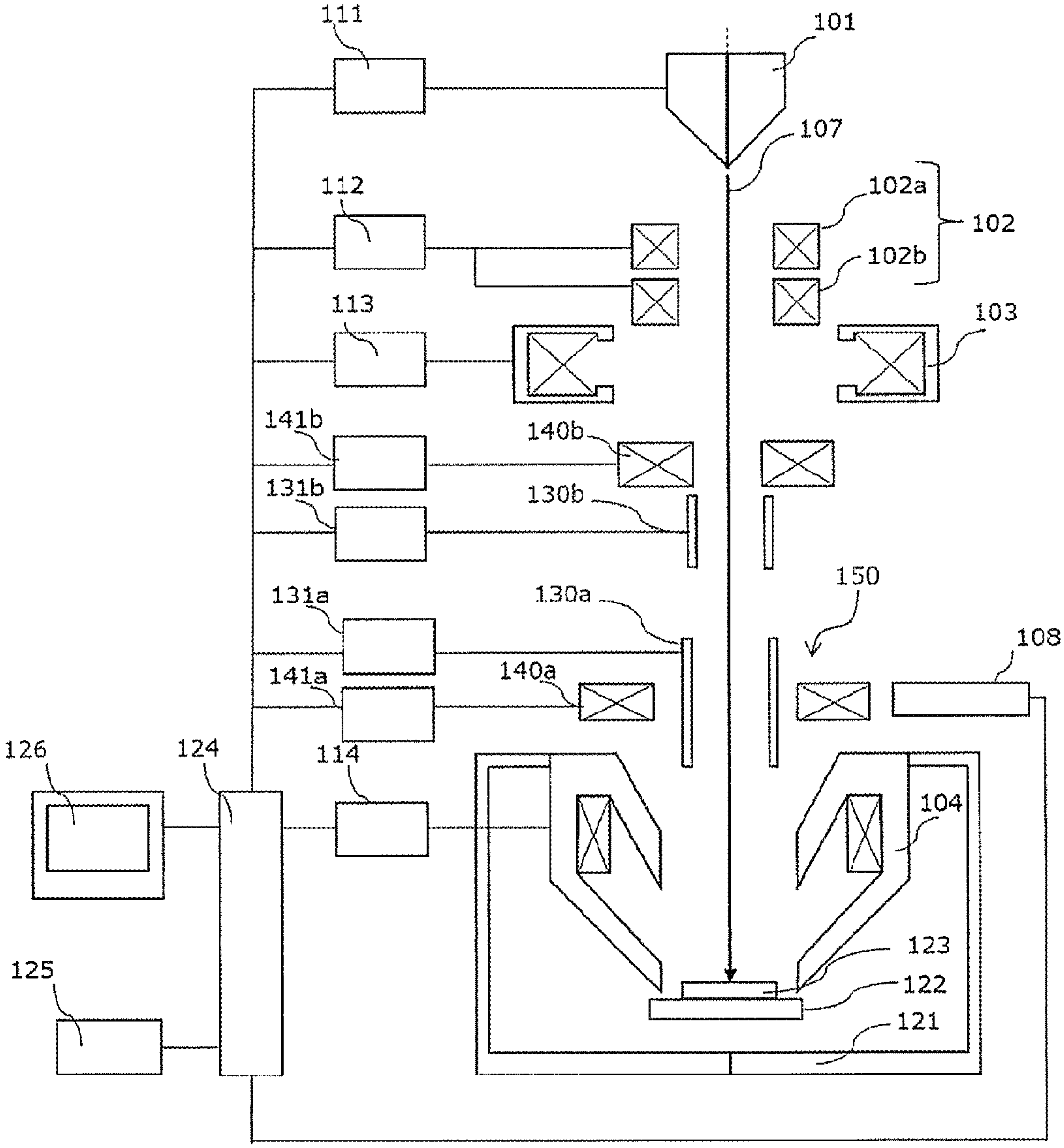

[FIG. 14]
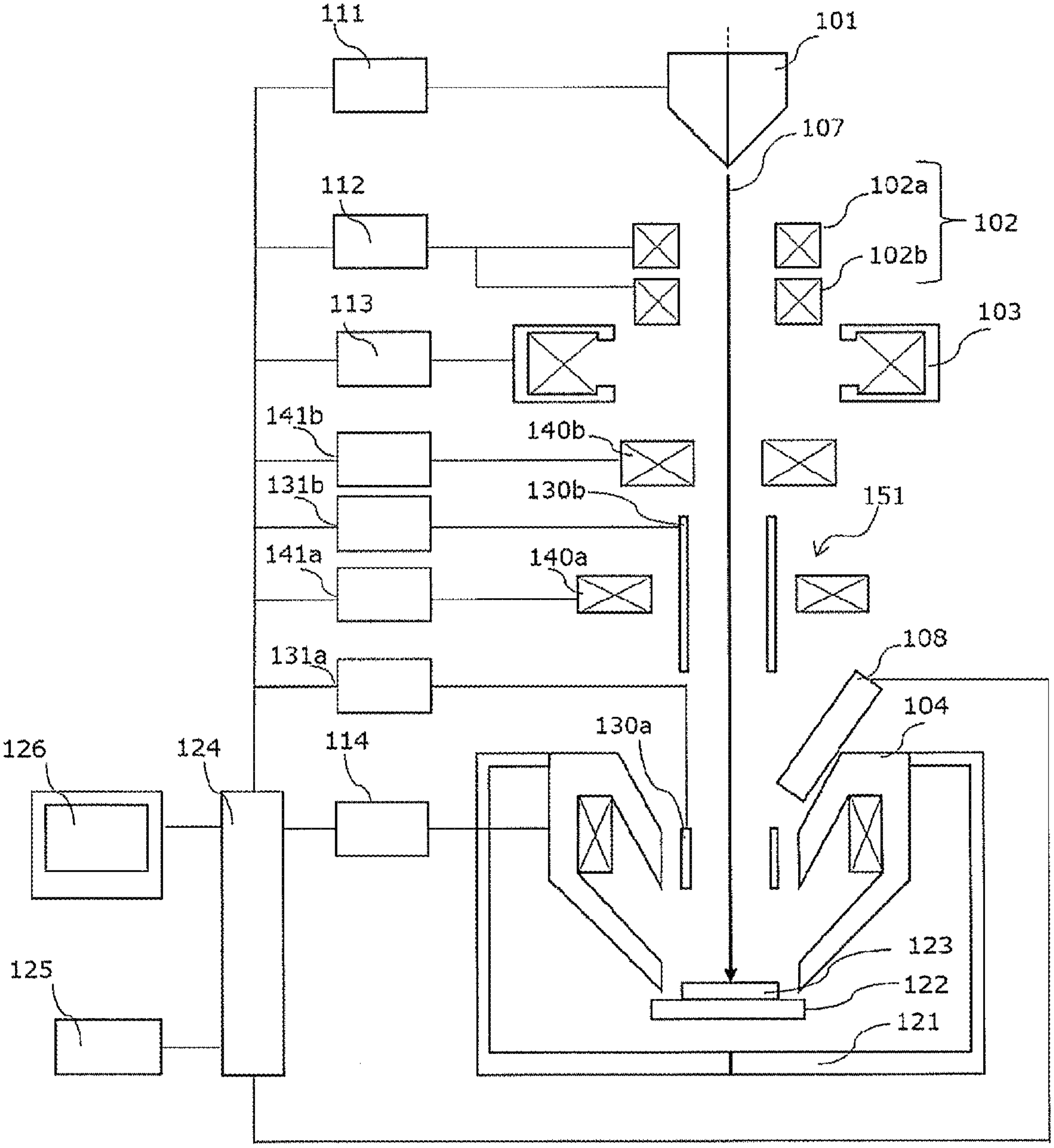

CHARGED PARTICLE BEAM DEVICE, AND BEAM DEFLECTION METHOD IN CHARGED PARTICLE BEAM DEVICE

TECHNICAL FIELD

The present invention relates to a charged particle beam apparatus (device) including an electric field deflector and a magnetic field deflector and a method of defecting a beam in the charged particle beam apparatus (device).

BACKGROUND ART

A charged particle beam apparatus such as a scanning electron microscope (SEM) or a focused ion beam (FIB) system performs observation, analysis, and processing of a microstructure using a charged particle beam. The charged particle beam apparatus is widely used in the fields of semiconductor, materials, and biotechnology. In these fields, a further improvement in image resolution and a further improvement in analysis and processing accuracy are required accompanying the miniaturization of a target sample. To achieve the improvements, it is necessary to restrict a lens aberration in order to reduce a beam diameter of a charged particle beam and it is necessary to obtain a large signal detection amount in order to increase a signal-to-noise ratio (S/N) of an acquired signal.

PTL 1 discloses an orthogonal electromagnetic field generator (hereinafter referred to as an E×B (E cross B)) that does not deflect a beam emitted from a charged particle beam source and deflects secondary electrons, which are emitted from a sample, off an irradiation axis (optical axis) of the beam. In the E×B, positions of a deflection fulcrum in both an electric field and a magnetic field are made coincident with each other. Further, a deflection angle in the electric field and a deflection angle in the magnetic field are adjusted such that a deflection direction obtained by a combination of the electric field deflection and the magnetic field deflection coincides with an optical axis direction. A condition in which the deflection effects on the beam by the electric field and the magnetic field cancel out each other is referred to as a Wien condition. An optical axis of the beam with the smallest beam aberration generated at an objective lens is referred to as an ideal optical axis.

Since the beam adjusted to pass through the ideal optical axis maintains the optical axis before and after passing through the E×B according to the Wien condition, it is possible to restrict the aberration of the objective lens. Further, the secondary electrons proceeding from the sample toward the charged particle beam source are deflected off the optical axis due to the effect of both the electric field and the magnetic field of the E×B, and are detected by a detector disposed off the optical axis in the vicinity of the E×B.

On the other hand, it is known that, in the E×B, an aberration (chromatic aberration) caused by a variation in beam energy is generated. This is because the dispersion amount of the beam due to the electric field and the magnetic field with respect to the variation in the beam energy is different, and the dispersion amount is not cancelled out by the electric field and the magnetic field.

A method of restricting such an existing chromatic aberration includes retarding of applying a negative voltage to the sample. However, for a section observation sample or the like in which an asymmetrical electric field distribution occurs in the vicinity of a surface of the sample due to voltage application, the retarding is not suitable since a degradation in resolution occurs due to the retarding. In this regard, PTL 1 discloses use of a plurality of E×B in order to restrict the chromatic aberration.

CITATION LIST

Patent Literature

PTL 1: Japanese Patent No. 2821153

SUMMARY OF INVENTION

Technical Problem

In the existing E×B, in order to achieve the Wien condition and to accurately make the positions of the deflection fulcrum of both the electric field and the magnetic field coincident with each other, a configuration in which an electric field deflector and a magnetic field deflector are unitized is adopted. Since a coil for magnetic field generation constituting the magnetic field deflector has a bobbin-like structure for a winding, a space is required. Accordingly, the E×B in which the electric field deflector and the magnetic field deflector are unitized also occupies a space.

On the other hand, since secondary electrons used for surface observation of the SEM mainly proceed into the objective lens by the focusing effect of the objective lens, in terms of detection efficiency, it is effective to dispose, inside the objective lens, a signal deflector and a detector for detecting a deflected signal.

However, a magnetic flux density is high in the vicinity of a tip end inside the objective lens, and it is necessary to secure a lens cross-sectional area to avoid magnetic saturation. Therefore, it is difficult to provide a space for providing the detector. If the lens cross-sectional area is not secured, a leakage magnetic field is generated due to magnetic saturation, resulting in a decrease in lens performance.

Accordingly, it is difficult to mount the unitized E×B (the electric field deflector and the magnetic field deflector), which includes the coil for magnetic field generation occupying a space, near the tip end of the objective lens having a small mounting space, that is, in the vicinity of the sample.

The invention provides a technique for improving the degree of freedom of an arrangement position of an electric field deflector and preventing occurrence of chromatic aberration caused by a variation in beam energy.

Solution to Problem

In order to solve the above problems, the invention provides a charged particle beam apparatus including: a charged particle beam source configured to emit a beam; a focusing lens configured to focus the beam emitted from the charged particle beam source; an objective lens configured to focus the beam on a sample; a first electric field deflector; a second electric field deflector; a first magnetic field deflector; a second magnetic field deflector; and a computer system configured to control deflection of the beam caused by the first electric field deflector, deflection of the beam caused by the second electric field deflector, deflection of the beam caused by the first magnetic field deflector, and deflection of the beam caused by the second magnetic field deflector. At least one of the first electric field deflector and the second electric field deflector is disposed on a plane different from a plane orthogonal to an optical axis of the beam on which the first magnetic field deflector and the second magnetic field deflector are disposed. The computer system controls deflection of the beam caused by the first electric field deflector and the second electric field deflector to move a first deflection fulcrum which is an intersection of the beam before deflection and the beam deflected by the first electric field deflector and the second electric field deflector, and controls deflection of the beam caused by the first magnetic field deflector and the second magnetic field deflector to move, independently of the first deflection fulcrum, a second deflection fulcrum which is an intersection of the beam before deflection and the beam deflected by the first magnetic field deflector and the second magnetic field deflector.

Advantageous Effects of Invention

According to the invention, a degree of freedom in an arrangement position of an electric field deflector is improved and a chromatic aberration caused by a variation in beam energy is prevented.

Problems, configurations, and effects other than those described above will be clarified by the following description of embodiments.

BRIEF DESCRIPTION OF DRAWINGS

FIG. 1 is a schematic diagram illustrating an overall configuration of an SEM according to Embodiment 1.

FIG. 2 is a diagram illustrating deflection of a beam caused by an electric field deflector according to Embodiment 1.

FIG. 3 is a diagram illustrating deflection of a beam caused by a magnetic field deflector according to Embodiment 1.

FIG. 4 is a schematic diagram illustrating a deflection trajectory of a beam when a deflection fulcrum of the beam deflected by the electric field deflector and the magnetic field deflector according to Embodiment 1 is made coincident with an object point of an objective lens.

FIG. 5 is a hardware block diagram of an integrated computer according to Embodiment 1.

FIG. 6 is a flowchart illustrating a method of deflecting a beam for making the deflection fulcrum of the beam deflected by the electric field deflector and the magnetic field deflector according to Embodiment 1 coincident with the object point of the objective lens.

FIG. 7 is a graph illustrating voltages applied to two electric field deflectors when voltage sources of two systems are used.

FIG. 8 is a graph illustrating voltages applied to two electric field deflectors when a voltage source of one system is used.

FIG. 9 is a schematic diagram illustrating an overall configuration of an SEM according to Embodiment 2.

FIG. 10 is a schematic diagram illustrating an overall configuration of an SEM according to a modification of Embodiment 2.

FIG. 11 is a schematic diagram illustrating the overall configuration of the SEM according to Embodiment 2.

FIG. 12 is a schematic diagram illustrating an overall configuration of an SEM according to Embodiment 3.

FIG. 13 is a schematic diagram illustrating an overall configuration of an SEM according to Embodiment 4.

FIG. 14 is a schematic diagram illustrating an overall configuration of an SEM according to Embodiment 5.

DESCRIPTION OF EMBODIMENTS

Embodiments of the invention will be described in detail with reference to the drawings. In the following embodiments, it is needless to say that a configuration (including steps in a flowchart) is not necessarily essential unless otherwise specified or unless clearly considered to be essential in principle. Hereinafter, preferred embodiments of the invention will be described with reference to the drawings.

In the following embodiments, an SEM as an embodiment of a charged particle beam apparatus is described as an example, and the charged particle beam apparatus of the invention is not limited to the SEM. The charged particle beam apparatus of the invention may be, for example, an ion microscope that emits hydrogen ions, helium ions, or ions of a liquid metal such as gallium, a focused ion beam (FIB) system, and a scanning transmission electron microscope (STEM). Hereinafter, components having the same function are denoted by the same reference signs, and a repeated description thereof is omitted.

Embodiment 1

An overall configuration of an SEM 1 will be described with reference to FIG. 1. In the SEM 1, a charged particle beam (hereinafter, simply referred to as a beam) 107 generated by an electron beam source 101, which is a charged particle beam source, passes through an alignment deflector 102, a focusing lens 103, and an objective lens 104, and is applied to a sample 123. The electron beam source 101, the alignment deflector 102, the focusing lens 103, and the objective lens 104 are controlled by an electron beam source control unit 111, an alignment deflector control unit 112, a focusing lens control unit 113, and an objective lens control unit 114, respectively. The sample 123 is placed on a sample stage 122 in a vacuum column 121. The beam 107 is focused by the focusing lens 103, and the objective lens 104 focuses the beam on the sample 123. The sample 123 is two-dimensionally scanned by a scanning deflector (not shown). At this time, secondary electrons and backscattered electrons are emitted from a surface of the sample 123, and are detected by a detector 108.

An integrated computer 124 controls operations of the entire SEM 1, and controls operations of the electron beam source control unit 111, the alignment deflector control unit 112, the focusing lens control unit 113, and the objective lens control unit 114. The integrated computer 124 generates an observation image indicating the unevenness of the surface of the sample 123 based on a signal detected by the detector 108, and displays the observation image on an image display device 126. The integrated computer 124 is communicably connected to a controller 125 (such as a keyboard and a mouse) and the image display device 126. An operator uses the controller 125 to display a control screen and an observation image on the image display device 126.

In order to restrict an off-axis aberration of the objective lens 104 to perform observation with high resolution, it is necessary to perform optical axis adjustment for passing the beam 107 through an ideal optical axis. The alignment deflector 102 for optical axis adjustment includes an X alignment deflector 102*a* and a Y alignment deflector 102*b* that two-dimensionally deflect the beam in a plane (X-Y plane) orthogonal to an optical axis of the beam 107. Here, a direction along the optical axis of the beam 107 is defined as a Z direction.

A signal for periodically changing excitation is transmitted from the integrated computer 124 to the objective lens 104, and a focusing effect of the objective lens 104 is periodically changed. Imparting such a periodic excitation change of the lens is referred to as "wobbling", and is generally used in manual optical axis adjustment. When the beam 107 passes through the ideal optical axis of the objective lens 104, the beam 107 passes through the objective lens 104 perpendicularly. Therefore, during execution of the wobbling, a focus position of the objective lens 104 periodically changes in an optical axis direction (Z direction) from the surface of the sample 123, but does not move in directions (X direction and Y direction) perpendicular to the optical axis. Accordingly, a center position of the observation image observed by the operator does not change, and blur occurs periodically in the observation image. On the other hand, when the beam 107 passes through a position deviated from the ideal optical axis of the objective lens 104, the beam 107 obliquely passes through the objective lens 104. Therefore, during execution of the wobbling, the focus position of the objective lens 104 changes in the directions (X direction and Y direction) perpendicular to the optical axis and changes in the Z direction. Accordingly, the center position of the observation image observed by the operator repeats reciprocating movement in a predetermined direction, and blur occurs periodically in the observation image. When the periodic movement of the center position of the observation image by the wobbling is observed, the operator adjusts the alignment deflectors 102*a* and 102*b* by using the alignment deflector control unit 112 to reduce the movement of the center position of the observation image, thereby implementing the optical axis adjustment.

The SEM 1 includes an electric field deflector (a first electric field deflector) 130*a*, an electric field deflector (a second electric field deflector) 130*b*, a magnetic field deflector (a first magnetic field deflector) 140*a*, and a magnetic field deflector (a second magnetic field deflector) 140*b* that are independent of one another on separate planes orthogonal to the optical axis of the beam 107 and are spaced apart. The electric field deflector 130*a* is disposed in a region having a narrow mounting space at a tip end of the objective lens 104. The electric field deflector 130*b*, the magnetic field deflector 140*a*, and the magnetic field deflector 140*b* are disposed in a region having a wide mounting space that is apart from the objective lens 104 in the direction of the electron beam source 101. Except that the electric field deflector 130*a* is disposed in a region having a narrow mounting space at the tip end of the objective lens 104, the arrangement of the electric field deflector 130*b*, the magnetic field deflector 140*a*, and the magnetic field deflector 140*b* is not limited.

In Embodiment 1, the electric field deflector 130*a* is disposed inside the objective lens 104. The electric field deflector 130*a* is disposed closer to the objective lens 104 and the sample 123 than is the detector 108. The electric field deflector 130*b*, the magnetic field deflector 140*a*, and the magnetic field deflector 140*b* are disposed closer to the electron beam source 101 than is the detector 108. The electric field deflector 130*a* deflects secondary electrons generated by irradiating the sample 123 with the beam 107, and the detector 108 detects the secondary electrons.

The electric field deflector 130*a*, the electric field deflector 130*b*, the magnetic field deflector 140*a*, and the magnetic field deflector 140*b* are controlled by an electric field deflector control unit 131*a*, an electric field deflector control unit 131*b*, a magnetic field deflector control unit 141*a*, and a magnetic field deflector control unit 141*b*, respectively. A power supply (current source, voltage source) is supplied from each control unit connected to the corresponding deflector.

The electric field deflector 130*a* and the electric field deflector 130*b* each having a structure, in which a plate-like electrode and a cylindrical electrode are combined, do not occupy a mounting space as compared with the magnetic field deflector 140*a* and the magnetic field deflector 140*b* each having a bobbin structure for coils. Further, as energy of the beam 107 decreases, a deflection effect exerted by the magnetic field weakens. Therefore, the magnetic field deflection effect on the secondary electrons having low energy (50 eV or less) used for generating the observation image is weaker than an electric field deflection effect. Accordingly, the electric field deflector 130*a* that generates an electric field having a relatively stronger deflection effect as compared with the magnetic field can be used as a deflector of the secondary electrons in the vicinity of the sample 123 where the mounting space is small, independent of the magnetic field deflectors 140*a* and 140*b*.

With reference to FIGS. 2 and 3, a chromatic aberration generated due to the electric field deflector and a chromatic aberration generated due to the magnetic field deflector will be described. In FIG. 2, a trajectory 170 of the beam 107 with energy $E_0$ is indicated by a solid line, the trajectory 170 of the beam 107 with energy $E_0+\Delta E_0/2$ is indicated by a one-dot chain line, and the trajectory 170 of the beam 107 with energy $E_0-\Delta E_0/2$ is indicated by a two-dot chain line. In FIG. 3, a trajectory 171 of the beam 107 with the energy $E_0$ is indicated by a solid line, the trajectory 171 of the beam 107 with the energy $E_0+\Delta E_0/2$ is indicated by a one-dot chain line, and the trajectory 171 of the beam 107 with the energy $E_0-\Delta E_0/2$ is indicated by a two-dot chain line.

A magnetic field deflection angle $\theta_E$ when the beam 107 with the energy $E_0$ passes through an electric field E of the electric field deflector 130 and a magnetic field deflection angle $\theta_B$ when the beam 107 with the energy $E_0$ passes through a magnetic field B of the magnetic field deflector 140 are expressed by Formula (1) and Formula (2), respectively.

[Formula 1]

$$\theta_E \propto \frac{|E|}{E_0} \quad (1)$$

[Formula 2]

$$\theta_B \propto \frac{|B|}{\sqrt{E_0}} \quad (2)$$

Based on Formula (1) and Formula (2), a change $\Delta\theta_E$ of the electric field deflection angle and a change $\Delta\theta_B$ of the magnetic field deflection angle with respect to the variation $\Delta E_0$ of the energy of the beam 107 are expressed by Formula (3) and Formula (4).

[Formula 3]

$$\Delta\theta_E = \theta_E \frac{\Delta E_0}{E_0} \quad (3)$$

[Formula 4]

$$\Delta\theta_B = \frac{1}{2}\theta_B \frac{\Delta E_0}{E_0} \quad (4)$$

As illustrated in FIG. 2, a distance between an object point 160 of the objective lens 104 and the electric field deflector 130 is defined as $L_E$, and as illustrated in FIG. 3, a distance between the object point 160 of the objective lens 104 and the magnetic field deflector 140 is defined as $L_B$. When an optical magnification of the objective lens 104 is defined as $M_{OBJ}$, a deflection amount $d_E$ of the beam 107 with the energy $E_0$ at the position of the sample 123 caused by the electric field and a deflection amount $d_B$ at the position of the sample 123 caused by the magnetic field are expressed by Formula (5) and Formula (6), respectively.

[Formula 5]

$$d_E = L_E \theta_E M_{OBJ} \tag{5}$$

[Formula 6]

$$d_B = L_B \theta_B M_{OBJ} \tag{6}$$

Based on Formula (5) and Formula (6), chromatic aberrations $\Delta d_E$ and $\Delta d_B$ generated due to the electric field deflection and the magnetic field deflection with respect to the variation $\Delta E_0$ of the energy of the beam 107 are expressed by Formula (7) and Formula (8), respectively. As indicated by Formula (7) and Formula (8), the chromatic aberrations $\Delta d_E$ and $\Delta d_B$ due to the electric field deflection and the magnetic field deflection are proportional to the distances $L_E$ and $L_B$ between the object point 160 of the objective lens 104 and respective deflection fulcrums of the electric field and the magnetic field. Accordingly, by making the deflection fulcrum coincident with the object point 160 of the objective lens 104, the chromatic aberration is restricted.

[Formula 7]

$$\Delta d_E = L_E \Delta\theta_E M_{OBJ} = L_B \theta_E \frac{\Delta E_0}{E_0} M_{OBJ} \tag{7}$$

[Formula 8]

$$\Delta d_B = L_\theta \Delta\theta_B M_{OBJ} = \frac{1}{2} L_B \theta_B \frac{\Delta B_0}{E_0} M_{OBJ} \tag{8}$$

Referring to FIG. 4, conditions that the deflection fulcrum of the beam 107 deflected by the two electric field deflectors 130*a* and 130*b* and the deflection fulcrum of the beam 107 deflected by the two magnetic field deflectors 140*a* and 140*b* coincide with the object point 160 of the objective lens 104 will be described. The deflection fulcrum of the beam 107 deflected by the two electric field deflectors 130*a* and 130*b* is an intersection of the beam 107 before deflection and the beam 107 deflected by the two electric field deflectors 130*a* and 130*b*. The deflection fulcrum of the beam 107 deflected by the two magnetic field deflectors 140*a* and 140*b* is an intersection of the beam 107 before deflection and the beam 107 deflected by the two magnetic field deflectors 140*a* and 140*b*.

Parameters shown in FIG. 4 geometrically satisfy Formulas (9) to (12). Further, since the deflection caused by the two electric field deflectors 130*a* and 130*b* and the deflection caused by the two magnetic field deflectors 140*a* and 140*b* cancel out each other, Formula (13) is satisfied.

[Formula 9]

$$\theta_{E1} = \theta_{E2} \frac{(L_{B1} + L_{E2})}{L_{E1}} \tag{9}$$

[Formula 10]

-continued $$\theta_{E0} = \theta_{E1} - \theta_{E2} \tag{10}$$

[Formula 11]

$$\theta_{B1} = \theta_{B2} \frac{(L_{B1} + L_{B2})}{L_{B1}} \tag{11}$$

[Formula 12]

$$\theta_{B0} = \theta_{B1} + \theta_{B2} \tag{12}$$

[Formula 13]

$$\theta_{E0} = \theta_{B0} \tag{13}$$

Next, a hardware configuration of the integrated computer 124 will be described with reference to FIG. 5. The integrated computer 124 is a computer system including a processor 124*a*, a main storage device 124*b*, an auxiliary storage device 124*c*, an input and output I/F (hereinafter, interface is abbreviated as I/F) 124*d*, a communication interface 124*e*, and a bus 124*f* that connects the above-described modules so as to be able to communicate with each other.

The processor 124*a* is a central processing unit that controls the operation of each unit of the SEM 1. The processor 124*a* is, for example, a central processing unit (CPU), a digital signal processor (DSP), or an application specific integrated circuit (ASIC). The processor 124*a* loads a program stored in the auxiliary storage device 124*c* to a work area of the main storage device 124*b* in an executable manner. The main storage device 124*b* stores a program to be executed by the processor 124*a*, data processed by the processor 124*a*, and the like. The main storage device 124*b* is a flash memory, a random access memory (RAM), a read only memory (ROM), or the like. The auxiliary storage device 124*c* stores an instruction code for executing each step of the flowchart in FIG. 6 described later. The auxiliary storage device 124*c* is, for example, a silicon disk including a non-volatile semiconductor memory (flash memory, erasable programmable ROM (EPROM)), a solid state drive device, or a hard disk drive (HDD) device. The input and output I/F 124*d* is communicably connected to the controller 125 and the image display device 126. The communication I/F 124*e* is communicably connected to an external device (not shown).

Next, with reference to FIG. 6, a method of deflecting a beam that satisfies Formulas (9) to (13) will be described.

An example in which each step in FIG. 6 is executed by the integrated computer 124 will be described. The subject executing each step in FIG. 6 may not be the integrated computer 124. Since the integrated computer 124 controls the operations of the electric field deflector control unit 131*a*, the electric field deflector control unit 131*b*, the magnetic field deflector control unit 141*a*, the magnetic field deflector control unit 141*b*, and the like, for example, the integrated computer 124 may execute each step in FIG. 6 in cooperation with the electric field deflector control unit 131*a*, the electric field deflector control unit 131*b*, the magnetic field deflector control unit 141*a*, the magnetic field deflector control unit 141*b*, and the like.

First, in accordance with an instruction from the operator or in an automatic manner, the integrated computer 124 turns off the electric field deflectors 130*a* and 130*b* and the magnetic field deflectors 140*a* and 140*b* to set a state in which the electric field deflectors 130*a* and 130*b* and the magnetic field deflectors 140*a* and 140*b* do not operate (S601). Next, in accordance with an instruction from the operator or in an automatic manner, the integrated computer 124 controls the deflection of the beam 107 by the alignment deflector 102 to make the optical axis of the beam 107 coincident with the ideal optical axis of the objective lens 104 (S602: adjustment step).

The deflection of the beam 107 by the electric field deflectors 130*a* and 130*b* is performed. The integrated computer 124 turns on the electric field deflector 130*a* so that a desired signal is detected from the electric field deflector 130*a* on the sample 123 side (S603: first electric field deflection step). At this time, the integrated computer 124 inputs a voltage value instructed by the operator or a default voltage value to the electric field is deflector 130*a*. For example, it preferentially considered to dispose the detector 108 near the sample 123 to obtain an image with high resolution by the detector 108. In this case, it is effective to set a voltage value for the electric field deflector 130*a* on the sample 123 side such that a detection amount of secondary electrons emitted from the sample 123 or back-scattered electrons is sufficient. At this time, a user may adjust the voltage value input to the electric field deflector 130*a* while changing the voltage value so that the image has desired resolution, or the voltage value input to the electric field deflector 130*a* may be automatically adjusted so that the resolution has an appropriate value. The voltage value set for the electric field deflector 130*a* is not particularly limited and is any value within an output range of a power supply voltage of the SEM 1.

Next, in accordance with an instruction from the operator or in an automatic manner, the integrated computer 124 turns on the electric field deflectors 130*a* and 130*b* simultaneously, and then turns off the electric field deflectors 130*a* and 130*b* simultaneously (S604: second electric field deflection step). At this time, in a state where the optical axis of the beam 107 is adjusted to the ideal optical axis of the objective lens 104, the integrated computer 124 controls the deflection of the beam 107 caused by the electric field deflectors 130*a* and 130*b*, and cancels out, by the electric field deflector 130*a* closer to the objective lens 104, the deflection of the beam 107 caused by the electric field deflector 130*b* farther from the objective lens 104. When the electric field deflectors 130*a* and 130*b* are simultaneously turned on and when the electric field deflectors 130*a* and 130*b* are simultaneously turned off, a voltage value input to the electric field deflector 130*b* is adjusted so that visual field movement of the observation image disappears. This adjustment may be manually performed by the operator while viewing the observation image, or may be automatically performed by performing image processing on the observation image to automatically determine presence or absence of the visual field movement. When there is no visual field movement of the observation image, the condition that the deflection fulcrum (first deflection fulcrum) of the beam 107 deflected by the two electric field deflectors 130*a* and 130*b* coincides with the object point 160 of the objective lens 104 is satisfied.

Then, when there is no visual field movement of the observation image, the integrated computer 124 stores, in the auxiliary storage device 124*c*, a voltage value (adjustment value) E_1 and a voltage value (adjustment value) E_2 that are input to each of the electric field deflectors 130*a* and 130*b* (S605). The voltage values input to the electric field deflectors 130*a* and 130*b* are deflection intensities of deflecting the beam 107. Then, the integrated computer 124 turns off the electric field deflectors 130*a* and 130*b* in accordance with an instruction from the operator or in an automatic manner (S606).

Next, the deflection of the beam 107 by the magnetic field deflectors 140*a* and 140*b* is performed. The integrated computer 124 inputs a current value (a current value instructed by the operator or a default current value) of any magnitude to the magnetic field deflector 140*a* on the sample 123 side so that a magnetic field of any magnitude is applied to a space (S607: first magnetic field deflection step). Next, in accordance with an instruction from the operator or in an automatic manner, the integrated computer 124 turns on the magnetic field deflectors 140*a* and 140*b* simultaneously, and then turns off the magnetic field deflectors 140*a* and 140*b* simultaneously (S608: second magnetic field deflection step). At this time, in a state where the optical axis of the beam 107 is adjusted to the ideal optical axis of the objective lens 104, the integrated computer 124 controls the deflection of the beam 107 caused by the magnetic field deflectors 140*a* and 140*b*, and cancels out, by the magnetic field deflector 140*a* closer to the objective lens 104, the deflection of the beam 107 caused by the magnetic field deflector 140*b* farther from the objective lens 104. When the magnetic field deflectors 140*a* and 140*b* are simultaneously turned on and when the magnetic field deflectors 140*a* and 140*b* are simultaneously turned off, a current value input to the magnetic field deflector 140*b* is adjusted so that the visual field movement of the observation image disappears. This adjustment may be manually performed by the operator while viewing the observation image, or may be automatically performed by performing image processing on the observation image to automatically determine presence or absence of the visual field movement. When there is no visual field movement of the observation image, the condition that the deflection fulcrum (second deflection fulcrum) of the beam 107 deflected by the two magnetic field deflectors 140*a* and 140*b* coincides with the object point 160 of the objective lens 104 is satisfied. Then, when there is no visual field movement of the observation image, the integrated computer 124 stores a ratio X of the current value (adjustment value) input to the magnetic field deflector 140*a* and the current value (adjustment value) input to the magnetic field deflector 140*b* (S609). The current values input to the magnetic field deflectors 140*a* and 140*b* are deflection intensities for deflecting the beam 107. Then, the integrated computer 124 turns off the magnetic field deflectors 140*a* and 140*b* in accordance with an instruction from the operator or in an automatic manner (S610).

Finally, mutual adjustment between the deflection of the beam 107 caused by the electric field deflectors 130*a* and 130*b* and the deflection of the beam 107 caused by the magnetic field deflectors 140*a* and 140*b* is performed. First, the integrated computer 124 inputs the stored adjustment values E_1 and E_2 to each of the electric field deflectors 130*a* and 130*b* in accordance with an instruction from the operator or in an automatic manner (S611). Next, the integrated computer 124 turns on the magnetic field deflectors 140*a* and 140*b*, and adjusts, at the ratio X, the current value (set value) input to the magnetic field deflectors 140*a* and 140*b* so that the beam is irradiated in the ideal optical axis (S612: third magnetic field deflection step). Differently from the adjustment in S602 in which the optical axis of the beam is made coincident with the ideal optical axis by controlling the alignment deflector 102, in the adjustment in S612, the optical axis of the beam is made coincident with the ideal optical axis by adjusting, at the ratio X, the current value (set value) input to the magnetic field deflectors 140*a* and 140*b*. This adjustment may be manually performed by the operator on the basis of the movement of the observation image when an excitation change is periodically imparted to the objective lens 104, or may be automatically performed by performing image processing on the observation image moving according to the excitation change of the objective lens 104. The integrated computer 124 stores a current value (adjustment value) B_1 and a current value (adjustment value) B_2 input to each of the magnetic field deflectors 140*a* and 140*b* when the optical axis of the beam coincides with the ideal optical axis (S613).

Accordingly, the adjustment values E_1, E_2, B_1, and B_2 can be obtained as conditions for making the deflection fulcrum of the beam deflected by the two electric field deflectors 130*a* and 130*b* and the deflection fulcrum of the beam deflected by the two magnetic field deflectors 140*a* and 140*b* coincident with the object point 160 of the objective lens 104 and making the optical axis of the beam coincident with the ideal optical axis.

Then, the integrated computer 124 sets the obtained adjustment values E_1, E_2, B_1, and B_2 for the electric field deflector 130*a*, the electric field deflector 130*b*, the magnetic field deflector 140*a*, and the magnetic field deflector 140*b* (S614).

The electric field deflectors 130*a* and 130*b* and the magnetic field deflectors 140*a* and 140*b* according to Embodiment 1 each perform deflection in only one direction and a reverse direction thereof in the X-Y plane. Accordingly, when a deflection direction of the beam 107 by the electric field deflector 130*a* and a deflection direction of the beam 107 by the electric field deflector 130*b* do not coincide with each other, such setting that the visual field movement of the observation image disappears completely cannot be performed. That is, such setting that the deflection fulcrum of the beam 107 deflected by the electric field deflectors 130*a* and 130*b* coincides with the object point 160 of the objective lens 104 cannot be performed. Similarly, when a deflection direction of the beam 107 by the magnetic field deflector 140*a* and a deflection direction of the beam 107 by the magnetic field deflector 140*b* do not coincide with each other, such setting that the visual field movement of the observation image disappears completely cannot be performed. That is, such setting that the deflection fulcrum of the beam 107 deflected by the magnetic field deflectors 140*a* and 140*b* coincides with the object point 160 of the objective lens 104 cannot be performed.

Therefore, it is sufficient to adopt a configuration in which at least one of the electric field deflector 130*a* and the electric field deflector 130*b* and at least one of the magnetic field deflector 140*a* and the magnetic field deflector 140*b* are capable of deflecting the beam 107 in any direction within a plane perpendicular to the optical axis of the beam 107. That is, it is sufficient that the number of electrodes of at least one of the electric field deflector 130*a* and the electric field deflector 130*b* is four or more. In addition, it is sufficient that the number of electrodes of at least one of the magnetic field deflector 140*a* and the magnetic field deflector 140*b* is four or more. According to this configuration, the deflection directions of the beam 107 by the electric field deflectors 130*a* and 130*b* can be made coincident with each other, and the deflection directions of the beam 107 by the magnetic field deflectors 140*a* and 140*b* can be made coincident with each other. As a result, the deflection fulcrum of the beam deflected by the two electric field deflectors 130*a* and 130*b* and the deflection fulcrum of the beam deflected by the two magnetic field deflectors 140*a* and 140*b* can be made coincident with the object point 160 of the objective lens 104.

In addition, strictly speaking, in order to cancel out the deflection directions in the electric field and the magnetic field to pass the beam 107 through the ideal optical axis at the center of the objective lens 104, it is necessary to adopt a configuration in which both the electric field deflectors 130*a* and 130*b* or both the magnetic field deflectors 140*a* and 140*b* are capable of deflecting the beam 107 in any direction. This is because, when the deflection direction in the electric field is defined as a T direction, an aberration component in the T direction can be restricted by the electric field and the magnetic field, but an aberration component having a direction perpendicular to the T direction, which occurs due to an angle deviation (Y degree) in electric field and magnetic field directions, cannot be restricted. Here, assuming that the angle deviation is 1 degree and the aberration component in the T direction is 100 nm, an aberration component T' having a direction perpendicular to the T direction is estimated to be T'=sin (1 degree)×100 (nm)=1.75 (nm). Since the value is smaller than a resolution numerical value at an extremely low acceleration voltage at which the aberration is likely to become obvious, the influence on the observation performance due to the aberration component that cannot be restricted can be estimated to be small as long as the angle deviation is not noticeable.

The object point 160 of the objective lens 104, that is, an image point of the focusing lens 103 disposed above the objective lens 104 is determined by a focusing lens value of the focusing lens 103. The focusing lens value and a position of the image point of the focusing lens at the focusing lens value are recorded by the integrated computer 124 as table values that depend on an acceleration voltage, a distance between the sample 123 and the objective lens 104, and an optical condition such as a beam amount. The table values may not necessarily be in a table format, and it is sufficient that the table values are stored in a storage device such as the auxiliary storage device 124*c* in association with the information.

The adjustment of making the deflection fulcrum of the beam deflected by the two electric field deflectors 130*a* and 130*b* and the deflection fulcrum of the beam deflected by the two magnetic field deflectors 140*a* and 140*b* coincident with the object point 160 of the objective lens 104 may be manually performed by using the beam deflection adjustment processing in FIG. 6 in each optical condition. As described below, an adjustment value manually adjusted certain optical condition may be expanded to an adjustment value in another optical condition.

As described above with reference to FIG. 6 and the like, there is provided a method of deflecting a beam in a charged particle beam apparatus, the charged particle beam apparatus including a charged particle beam source configured to emit a beam, a scanning deflector configured to perform scanning with the beam emitted from the charged particle beam source, a focusing lens configured to focus the beam, an objective lens configured to focus the beam on a sample, a first electric field deflector, a second electric field deflector, a first magnetic field deflector, a second magnetic field deflector, and a computer system configured to control deflection of the beam caused by the first electric field deflector, deflection of the beam caused by the second electric field deflector, deflection of the beam caused by the first magnetic field deflector, and deflection of the beam caused by the second magnetic field deflector, and in the charged particle beam apparatus, at least one of the first electric field deflector and the second electric field deflector is disposed on a plane different from a plane orthogonal to an optical axis of the beam on which the first magnetic field deflector and the second magnetic field deflector are disposed, the method including: an adjustment step (S602) of adjusting the optical axis of the beam to an ideal optical axis of the objective lens; a first electric field deflection step (S603) of deflecting the beam by the first electric field deflector; a second electric field deflection step (S604) of deflecting the beam by the second electric field deflector, and moving a first deflection fulcrum, which is an intersection of the beam before deflection and the beam deflected by the first electric field deflector and the second electric field deflector, to an object point (160) of the objective lens; a first magnetic field deflection step (S607) of deflecting the beam by the first magnetic field deflector; a second magnetic field deflection step (S608) of deflecting the beam by the second magnetic field deflector, and moving a second deflection fulcrum, which is an intersection of the beam before deflection and the beam deflected by the first magnetic field deflector and the second magnetic field deflector, to the object point (160) of the objective lens; and a third magnetic field deflection step (S609) of deflecting the beam by the first magnetic field deflector and the second magnetic field deflector, at a ratio (ratio X) of a deflection intensity of the beam by the first magnetic field deflector to a deflection intensity of the beam by the second magnetic field deflector when the second deflection fulcrum is moved to the object point of the objective lens in the second magnetic field deflection step in a state where the first deflection fulcrum is moved to the object point of the objective lens in the second electric field deflection step.

Hereinafter, a method of expanding an adjustment value manually adjusted in a certain optical condition to an adjustment value in another optical condition will be described. A method of adjusting the electric field deflectors 130*a* and 130*b* and the magnetic field deflectors 140*a* and 140*b* in any optical condition by using table values relating to the focusing lens value and the position of the image point of the focusing lens and the adjustment values of the electric field deflectors 130*a* and 130*b* and the magnetic field deflectors 140*a* and 140*b* adjusted in a certain optical condition will be described.

Voltage values and current values of the electric field deflectors 130*a* and 130*b* and the magnetic field deflectors 140*a* and 140*b* corresponding to the adjustment values E_1, E_2, B_1, and B_2 of the electric field deflectors 130*a* and 130*b* and the magnetic field deflectors 140*a* and 140*b* which are adjusted and recorded using the beam deflection adjustment processing in FIG. 6 are set as $V_{E1}$, $V_{E2}$, $I_{B1}$, and $I_{B2}$, respectively. If the optical condition at this time is referred to as condition 1, the above Formula (9) is satisfied in condition 1.

Here, a relational expression of the voltage value and the deflection angle of the electric field deflectors 130*a* and 130*b* is expressed as Formulas (14) and (15) using constants $T_{E1}$ and $T_{E2}$. Accordingly, Formula (16) is satisfied from Formulas (9), (14), and (15). As a result, Formula (17) is satisfied.

[Formula 14]

$$\theta_{E1} = T_{E1}V_{E1} \tag{14}$$

[Formula 15]

$$\theta_{E2} = T_{E2}V_{E2} \tag{15}$$

[Formula 16]

$$T_{E1}V_{E1} = T_{E2}V_{E2}\frac{L_{E1}+L_{E2}}{L_{E1}} \tag{16}$$

-continued

[Formula 17]

$$\frac{T_{E1}}{T_{E2}} = \frac{V_{E2}}{V_{E1}}\frac{(L_{E1}+L_{E2})}{L_{E1}} \tag{17}$$

On the other hand, in another optical condition, the position of the image point of the focusing lens 103 changes from $L_{E1}$. This optical condition is referred to as condition 2, and a change in the position of the image point of the focusing lens 103 is set as ΔZ, and the position of the image point of the focusing lens 103 is set as $L_{E1}+\Delta Z$. Here, adjustment values obtained when the electric field deflectors 130*a* and 130*b* and the magnetic field deflectors 140*a* and 140*b* are adjusted in condition 2 are set as E'_1, E'_2, B'_1, and B'_2, and voltage values and current values of the electric field deflectors 130*a* and 130*b* and the magnetic field deflectors 140*a* and 140*b* are set as $V_{E'1}$, $V_{E'2}$, $I_{B'1}$, and $I_{B'2}$, respectively. In condition 2, Formula (18) is satisfied from the same derivation as Formula (16). Here, from Formulas (17) and (18), Formula (19) is satisfied.

[Formula 18]

$$T_{E1}V_{E'1} = T_{E2}V_{E'2}\frac{L_{E1}+L_{E2}+\Delta Z}{L_{E1}+\Delta Z} \tag{18}$$

[Formula 19]

$$\frac{V_{E'1}}{V_{E'2}} = \frac{T_{E2}}{T_{E1}}\frac{(L_{E1}+L_{B2}+\Delta Z)}{L_{E1}+\Delta Z} = \frac{V_{E1}}{V_{E2}}\frac{(L_{E1}+L_{E2}+\Delta Z)}{L_{E1}+\Delta Z}\frac{L_{E1}}{(L_{E1}+L_{E2})} \tag{19}$$

In Formula (19), since the voltage values $V_{E1}$ and $V_{E2}$ when the adjustment of condition 1 is performed are known and $L_{E1}$, $L_{E2}$, and ΔZ are recorded as table values, a ratio of values of $V_{E''1}$ and $V_{E'2}$ in condition 2 is obtained.

Similarly, a relational expression of the current value and the deflection angle of the magnetic field deflectors 140*a* and 140*b* is expressed as Formulas (20) and (21) using constants $T_{B1}$ and $T_{B2}$. Accordingly, Formula (22) is satisfied from Formulas (11), (20), and (21). As a result, Formula (23) is satisfied.

[Formula 20]

$$\theta_{B1} = T_{B1}\sqrt{I_{B1}} \tag{20}$$

[Formula 21]

$$\theta_{B2} = T_{B2}\sqrt{I_{B2}} \tag{21}$$

[Formula 22]

$$T_{B1}\sqrt{I_{B1}} = T_{B2}\sqrt{I_{B2}}\frac{L_{B1}+L_{B2}}{L_{B1}} \tag{22}$$

[Formula 23]

$$\frac{T_{B1}}{T_{B2}} = \sqrt{\left(\frac{I_{B2}}{I_{B1}}\right)}\frac{(L_{B1}+L_{B2})}{L_{B1}} \tag{23}$$

On the other hand, in the optical condition of condition 2, the position of the image point of the focusing lens 103 changes from $L_{B1}$. The change in the position of the image point of the focusing lens 103 is AZ, and the position of the image point of the focusing lens 103 is $L_{B1}$-ΔZ. In condition 2, Formula (24) is satisfied from the same derivation as Formula (22). Here, from Formulas (23) and (24), Formula (25) is satisfied.

[Formula 24]

$$T_{B1}\sqrt{I_{B'1}} = T_{B2}\sqrt{I_{B'2}}\frac{L_{B1}+L_{B2} \rightarrow \Delta Z}{L_{B1}-\Delta Z} \tag{24}$$

[Formula 25]

$$\sqrt{\left(\frac{I_{B'1}}{I_{B'2}}\right)\frac{(L_{B1}+L_{B2})}{L_{B1}}} = \frac{T_{B2}}{T_{B1}}\frac{(L_{B1}+L_{B2}-\Delta Z)}{L_{B1}-\Delta Z} = \sqrt{\left(\frac{I_{B1}}{I_{B2}}\right)\frac{(L_{B1}+L_{B2}-\Delta Z)}{L_{B1}-\Delta Z}\frac{L_{B1}}{(L_{B1}+L_{B2})}} \tag{25}$$

In Formula (25), since the current values $I_{B1}$ and $I_{B2}$ Of the deflectors when the adjustment of condition 1 is performed are known and $L_{B1}$, $L_{B2}$, and $\Delta Z$ are recorded as table values, a ratio of values of the $I_{B'1}$ and $I_{B'2}$ in condition 2 is obtained.

On the other hand, Formula (26) is satisfied from Formulas (10), (12), and (13). Further, from Formulas (9) and (11), Formulas (27) and (28) are satisfied. From Formulas (15) and (20), Formulas (29) and (30) are satisfied.

[Formula 26]

$$\theta_{E1}-\theta_{E2}=\theta_{B1}+\theta_{B2} \tag{26}$$

[Formula 27]

$$\theta_{E2}\frac{(L_{E1}+L_{B2})}{L_{E1}}-\theta_{E2}=\theta_{B2}\frac{(L_{B1}+L_{B2})}{L_{B1}}+\theta_{B2} \tag{27}$$

[Formula 28]

$$\theta_{E2}\frac{L_{E2}}{L_{E1}}=\theta_{B2}\frac{(2L_{B1}+L_{B2})}{L_{B1}} \tag{28}$$

[Formula 29]

$$T_{E2}V_{E2}\frac{L_{E2}}{L_{E1}}=T_{B2}\sqrt{I_{B2}}\frac{(2L_{B1}+L_{B2})}{L_{B1}} \tag{29}$$

[Formula 30]

$$\frac{T_{E2}}{T_{B2}}=\frac{\sqrt{I_{B2}}}{V_{E2}}\frac{L_{E1}}{L_{E2}}\frac{(2L_{B1}+L_{B2})}{L_{B1}} \tag{30}$$

In Formula (30), since the voltage values $V_{E1}$ and $V_{E2}$ and the current values $I_{B1}$ and $I_{B2}$ of the electric field deflectors 130*a* and 130*b* when the adjustment is performed in the optical condition of condition 1 are known and $L_{E1}$, $L_{E2}$, $L_{B1}$, $L_{B2}$, and $\Delta Z$ are recorded as table values, a ratio of values of $T_{E2}$ and $T_{B2}$ is obtained.

Similarly, in the optical condition of condition 2, in consideration of the change $\Delta Z$ in the position of the image point of the focusing lens 103, Formula (31) is obtained. From Formulas (15) and (20), Formulas (32) and (33) are satisfied. From Formula (30), since the ratio of the values of $T_{E2}$ and $T_{B2}$ is known and $L_{E1}$, $L_{E2}$, $L_{B1}$, $L_{B2}$, and AZ are recorded as table values, a ratio of values of $V_{E'2}$ and $\sqrt{I_{B'2}}$ in Formula (33) in the optical condition of condition 2 is obtained.

[Formula 31]

$$\theta_{E'2}\frac{(L_{E1}+L_{E2}+\Delta Z)}{L_{E1}+\Delta Z}-\theta_{E'2}=\theta_{B'2}\frac{(L_{B1}+L_{B2}-\Delta Z)}{L_{B1}-\Delta Z}+\theta_{B'2} \tag{31}$$

[Formula 32]

-continued $$T_{B2}V_{E'2}\frac{L_{E2}}{L_{E1}+\Delta Z}=T_{B2}\sqrt{I_{B'2}}\frac{(2L_{B1}+L_{B2}-2\Delta Z)}{L_{B1}-\Delta Z} \tag{32}$$

[Formula 33]

$$\frac{V_{E'2}}{\sqrt{I_{B'2}}}=\frac{T_{B2}}{T_{E2}}\frac{(2L_{B1}+L_{B2}-2\Delta Z)}{L_{B1}-\Delta Z}\frac{(L_{B1}+\Delta Z)}{L_{E2}} \tag{33}$$

When the value of $V_{E'1}$ in condition 2 is set by using the above relational expressions, $V_{E'2}$ is obtained from Formula (19), $\sqrt{I_{B'2}}$ is obtained from Formula (33), and $\sqrt{I_{B'1}}$ is obtained from Formula (25) by using the table values of the image point position of the focusing lens recorded by the integrated computer 124. According to the method described above, by using the adjustment values E_1, E_2, B_1, and B_2 of the electric field deflectors 130*a* and 130*b* and the magnetic field deflectors 140*a* and 140*b* in condition 1, it is possible to set the adjustment values of the electric field deflectors 130*a* and 130*b* and the magnetic field deflectors 140*a* and 140*b* in any other optical conditions. As a result, as compared with a case where the adjustment values of the electric field deflectors 130*a* and 130*b* and the magnetic field deflectors 140*a* and 140*b* are adjusted manually for each optical condition, it is easy to adjust the adjustment values in any other optical conditions.

Effects of Embodiment 1

In Embodiment 1, by using the electric field deflector 130*a* independent of the magnetic field deflector 140*a*, it is possible to mount the electric field deflector 130*a* at a tip end of the objective lens 104 which is a region having a narrow mounting space. Accordingly, high detection performance can be achieved, and an observation image with high image quality can be obtained.

In Embodiment 1, according to the flowchart in FIG. 6, the deflection fulcrum of the beam deflected by the two electric field deflectors 130*a* and 130*b* and the deflection fulcrum of the beam deflected by the two magnetic field deflectors 140*a* and 140*b* are made coincident with the object point 160 of the objective lens 104. In this way, in the configuration in which the electric field deflectors 130*a* and 130*b* and the magnetic field deflectors 140*a* and 140*b* are disposed independently, it is possible to restrict the chromatic aberration caused by the variation in the beam energy.

By controlling, at the ratio X, the deflection of the beam 107 caused by the magnetic field deflectors 140*a* and 140*b*, the chromatic aberration and the off-axis aberration can be restricted.

Embodiment 2

In Embodiment 2, a preferable configuration of the electric field deflectors 130*a* and 130*b* is described from the viewpoint of power supply noise countermeasure. In Embodiment 1, an example in which individual voltage sources of two systems are used as the voltage sources of the electric field deflectors 130*a* and 130*b* is described. FIG. 7 illustrates a voltage value 401 of the electric field deflector 130*a*, a voltage value 402 of the electric field deflector 130*b*, a noise phase 403 of the electric field deflector 130*a*, and a noise phase 404 of the electric field deflector 130*b* in a case where an individual voltage source is used for each of the electric field deflectors 130*a* and 130*b*. In FIG. 7, a phase shift 405 occurs in noise components of the noise phases 403 and 404. Accordingly, even in a state where the deflection fulcrum of the beam 107 deflected by the electric field deflectors 130*a* and 130*b* coincides with the object point 160 of the objective lens 104, the deflection fulcrum is changed from the object point 160 of the objective lens 104 due to the noise component. That is, the position irradiated with the beam 107 changes, and image noise is generated in the observation image.

Next, FIG. 8 illustrates the voltage value 401 of the electric field deflector 130*a*, the voltage value 402 of the electric field deflector 130*b*, the noise phase 403 of the electric field deflector 130*a*, and the noise phase 404 of the electric field deflector 130*b* in a case where a voltage source of one system is used as a voltage source of the electric field deflectors 130*a* and 130*b*. In FIG. 8, the phases of the noise components of both the electric field deflectors 130*a* and 130*b* coincide with each other. Accordingly, the state in which the deflection fulcrum coincides with the object point 160 of the objective lens 104 is maintained regardless of the noise component, and no image noise is generated in the observation image.

As described above, one system of (common) voltage source can be used as the voltage source of the two electric field deflectors 130*a* and 130*b*. As illustrated in FIG. 9, the electric field deflector control unit 131 may be connected to the two electric field deflectors 130*a* and 130*b* and provide a power supply common to the two electric field deflectors, and the same voltage value may be applied using the voltage source of one system, or as illustrated in FIG. 10, a resistor 130*c* may be used to apply different voltage values.

In Embodiment 2, the voltage source of the two electric field deflectors 130*a* and 130*b* is one system, and the current source of the two magnetic field deflectors 140*a* and 140*b* may be one system in order to cancel out noise phases of the current source of the magnetic field deflectors 140*a* and 140*b*. However, as compared with the responsiveness to the noise of the voltage source of the electric field deflectors 130*a* and 130*b*, the responsiveness to the noise of the current source of the magnetic field deflectors 140*a* and 140*b* is low. Therefore, even when the current source of one system is used, it is necessary to consider a case where a shift occurs in noise phase.

Effects of Embodiment 2

In Embodiment 2, by making the voltage source of the two electric field deflectors 130*a* and 130*b* one system, an observation image with reduced image noise can be obtained. Further, by making the voltage source of the two magnetic field deflectors 140*a* and 140*b* one system, an observation image with reduced image noise can be obtained. Other effects are the same as those of Embodiment 1, and a description thereof is omitted.

Embodiment 3

In Embodiment 1, a configuration is illustrated in which the electric field deflectors 130*a* and 130*b* and the magnetic field deflectors 140*a* and 140*b* for deflection fulcrum adjustment are used to achieve three points of chromatic aberration restriction, off-axis aberration restriction, and high detection performance. The configuration of achieving the above three points is not limited to the configuration of Embodiment 1. For example, at least one of the electric field deflectors 130*a* and 130*b* and the magnetic field deflector 140*a* or 140*b* may also be used in another application.

In Embodiment 3, as illustrated in FIG. 11, the alignment deflector 102 for optical adjustment is used as a magnetic field deflector for deflection fulcrum adjustment. That is, an SEM according to Embodiment 3 includes two electric field deflectors 130*a* and 130*b*, the magnetic field deflector 140*a*, and the alignment deflector 102 used as a magnetic field deflector.

Effects of Embodiment 3

Since at least one of the electric field deflectors 130*a* and 130*b* and the magnetic field deflector 140*a* or 140*b* can be used in other applications, the configuration of the apparatus can be simplified. Other effects are the same as those of Embodiment 1, and a description thereof is omitted.

Embodiment 4

As illustrated in FIG. 12, an SEM according to Embodiment 4 includes a conversion electrode 302 configured to convert secondary electrons 300 and backscattered electrons 301 at the time of execution of retardation, a detector 304 configured to detect secondary electrons 303 generated by conversion by the conversion electrode 302, a deflection electrode 305 configured to deflect the secondary electrons 303 generated by the conversion by the conversion electrode 302 toward the detector 304, and a deflection electrode control unit 306 configured to control deflection caused by the deflection electrode 305. In Embodiment 4, the deflection electrode 305 is used as an electric field deflector for deflection fulcrum adjustment.

Effects of Embodiment 4

By using the deflection electrode 305 configured to deflect the secondary electrons 303 as an electric field deflector, the configuration of the apparatus can be simplified. Other effects are the same as those of Embodiment 1, and a description thereof is omitted.

Embodiment 5

In Embodiment 1, the E×B in which the electric field deflector and the magnetic field deflector are unitized is not used, and in Embodiment 5, the E×B is used. As illustrated in FIG. 13, an SEM according to Embodiment 5 includes an E×B 150 in which the electric field deflector 130*a* and the magnetic field deflector 140*a* are unitized, the electric field deflector 130*b*, and the magnetic field deflector 140*b*. The electric field deflector 130*a* and the magnetic field deflector 140*a* constituting the E×B 150 are disposed on the same plane orthogonal to the optical axis of the beam 107.

Effects of Embodiment 5

In Embodiment 5, the E×B in which an electric field deflector and a magnetic field deflector are unitized can be adopted in the SEM. In Embodiment 5, by adopting the electric field deflector 130*b* and the magnetic field deflector 140*b* that are independent, the degree of freedom in arrangement positions of the electric field deflector 130*b* and the magnetic field deflector 140*b* is improved.

Embodiment 6

In Embodiment 6, an E×B 151 in which the electric field deflector 130*b* and the magnetic field deflector 140*a* are unitized is used. As illustrated in FIG. 14, an SEM according to Embodiment 6 includes the electric field deflector 130*a*, the E×B 151 in which the electric field deflector 130*b* and the magnetic field deflector 140*a* are unitized, and the magnetic field deflector 140*b*. The electric field deflector 130*b* and the magnetic field deflector 140*a* constituting the E×B 151 are disposed on the same plane orthogonal to the optical axis of the beam 107.

Effects of Embodiment 6

In Embodiment 6, as in Embodiment 5, the E×B in which an electric field deflector and a magnetic field deflector are unitized can be adopted in the SEM. Further, in Embodiment 6, since a distance between the sample 123 and a position where the secondary electrons or backscattered electrons are deflected is shortened, a large signal detection amount can be obtained by the detector 108.

The invention is not limited to the above-described embodiments, and includes various modifications. The above-described embodiments have been described in detail to facilitate understanding of the invention, and the invention is not necessarily limited to those including all the configurations described above. A part of a configuration in one embodiment can be replaced with a configuration in another embodiment, and a configuration in one embodiment can also be added to a configuration in another embodiment. A part of a configuration in each embodiment may also be added to, deleted from, or replaced with another configuration.

REFERENCE SIGNS LIST

1: SEM
101: ELECTRON BEAM SOURCE
102: ALIGNMENT DEFLECTOR
102*a*: X ALIGNMENT DEFLECTOR
102*b*: Y ALIGNMENT DEFLECTOR
103: FOCUSING LENS
104: OBJECTIVE LENS
107: CHARGED PARTICLE BEAM
108: DETECTOR
111: ELECTRON BEAM SOURCE CONTROL UNIT
112: ALIGNMENT DEFLECTOR CONTROL UNIT
113: FOCUSING LENS CONTROL UNIT
114: OBJECTIVE LENS CONTROL UNIT
121: VACUUM COLUMN
122: SAMPLE STAGE
123: SAMPLE
124: INTEGRATED COMPUTER
125: CONTROLLER
126: IMAGE DISPLAY DEVICE
130*a*: ELECTRIC FIELD DEFLECTOR
130*b*: ELECTRIC FIELD DEFLECTOR
131: ELECTRIC FIELD DEFLECTOR CONTROL UNIT
131*a*: ELECTRIC FIELD DEFLECTOR CONTROL UNIT
131*b*: ELECTRIC FIELD DEFLECTOR CONTROL UNIT
130*c*: RESISTOR
140*a*: MAGNETIC FIELD DEFLECTOR
140*b*: MAGNETIC FIELD DEFLECTOR
141*a*: MAGNETIC FIELD DEFLECTOR CONTROL UNIT
141*b*: MAGNETIC FIELD DEFLECTOR CONTROL UNIT
150: E×B
151: E×B
160: OBJECT POINT
170: TRAJECTORY OF BEAM DEFLECTED BY ELECTRIC FIELD
171: TRAJECTORY OF BEAM DEFLECTED BY MAGNETIC FIELD
300: SECONDARY ELECTRON
301: BACKSCATTERED ELECTRON
302: CONVERSION ELECTRODE
303: SECONDARY ELECTRON
304: DETECTOR
305: DEFLECTION ELECTRODE
306: DEFLECTION ELECTRODE CONTROL UNIT
401: VOLTAGE VALUE OF ELECTRIC FIELD DEFLECTOR 130*a*
402: VOLTAGE VALUE OF ELECTRIC FIELD DEFLECTOR 130*b*
403: NOISE PHASE OF ELECTRIC FIELD DEFLECTOR 130*a*
404: NOISE PHASE OF ELECTRIC FIELD DEFLECTOR 130*b*
405: SHIFT OF NOISE PHASE

The invention claimed is:

1. A charged particle beam apparatus comprising:
a charged particle beam source configured to emit a beam;
a focusing lens configured to focus the beam emitted from the charged particle beam source;
an objective lens configured to focus the beam on a sample;
a first electric field deflector;
a second electric field deflector;
a first magnetic field deflector;
a second magnetic field deflector;
a detector configured to detect secondary electrons emitted from the sample irradiated with the beam; and
a computer system configured to control deflection of the beam caused by the first electric field deflector, deflection of the beam caused by the second electric field deflector, deflection of the beam caused by the first magnetic field deflector, and deflection of the beam caused by the second magnetic field deflector, wherein
at least one of the first electric field deflector and the second electric field deflector is disposed on a plane different from a plane orthogonal to an optical axis of the beam on which the first magnetic field deflector and the second magnetic field deflector are disposed, and
the computer system
controls deflection of the beam caused by the first electric field deflector and the second electric field deflector to move a first deflection fulcrum which is an intersection of the beam before deflection and the beam deflected by the first electric field deflector and the second electric field deflector, and
controls deflection of the beam caused by the first magnetic field deflector and the second magnetic field deflector to move, independently of the first deflection fulcrum, a second deflection fulcrum which is an intersection of the beam before deflection and the beam deflected by the first magnetic field deflector and the second magnetic field deflector,
wherein the first electric field deflector is disposed closer to the objective lens than is the detector, and the second electric field deflector, the first magnetic field deflector, and the second magnetic field deflector are disposed closer to the charged particle beam source than is the detector.

2. The charged particle beam apparatus according to claim 1, wherein
the first electric field deflector is disposed inside the objective lens.

3. The charged particle beam apparatus according to claim 1, wherein
in a state where the optical axis of the beam is adjusted to an ideal optical axis of the objective lens, the computer system controls the deflection of the beam caused by the first electric field deflector and the second electric field deflector to cancel out, by the first electric field deflector closer to the objective lens, the deflection of the beam caused by the second electric field deflector farther from the objective lens, and
in a state where the optical axis of the beam is adjusted to the ideal optical axis of the objective lens, the computer system controls the deflection of the beam caused by the first magnetic field deflector and the second magnetic field deflector to cancel out, by the first magnetic field deflector closer to the objective lens, the deflection of the beam caused by the second magnetic field deflector farther from the objective lens.

4. The charged particle beam apparatus according to claim 3, wherein
the computer system controls the deflection of the beam caused by the first magnetic field deflector and the second magnetic field deflector at a ratio of a deflection intensity of the beam by the first magnetic field deflector to a deflection intensity of the beam by the second magnetic field deflector when the deflection of the beam caused by the second magnetic field deflector is cancelled out by the first magnetic field deflector in a state where the deflection of the beam caused by the second electric field deflector is cancelled out by the first electric field deflector.

5. The charged particle beam apparatus according to claim 1, wherein
the computer system uses a first optical condition and a deflection intensity of the beam by the first electric field deflector, a deflection intensity of the beam by the second electric field deflector, a deflection intensity of the beam by the first magnetic field deflector, and a deflection intensity of the beam by the second magnetic field deflector that are set in the first optical condition, to set a deflection intensity of the beam by the first electric field deflector, a deflection intensity of the beam by the second electric field deflector, a deflection intensity of the beam by the first magnetic field deflector, and a deflection intensity of the beam by the second magnetic field deflector in a second optical condition different from the first optical condition.

6. The charged particle beam apparatus according to claim 1, wherein
the number of electrodes of at least one and the first electric field deflector or the second electric field deflector is four or more.

7. The charged particle beam apparatus according to claim 1, wherein
the number of electrodes of at least one and the first magnetic field deflector or the second magnetic field deflector is four or more.

8. The charged particle beam apparatus according to claim 1, wherein
the number of electrodes of both the first electric field deflector and the second electric field deflector is four or more, or the number of electrodes of both the first magnetic field deflector and the second magnetic field deflector is four or more.

9. The charged particle beam apparatus according to claim 1, wherein
the first electric field deflector and the second electric field deflector have a common power supply.

10. The charged particle beam apparatus according to claim 9, wherein
a resistor is disposed at least between the power supply and the first electric field deflector or between the power supply and the second electric field deflector.

11. The charged particle beam apparatus according to claim 1, wherein
the first electric field deflector, the second electric field deflector, the first magnetic field deflector, and the second magnetic field deflector are disposed independently of one another on separate planes orthogonal to the optical axis of the beam.

12. The charged particle beam apparatus according to claim 1, wherein
the first electric field deflector is disposed closer to the objective lens than is the second electric field deflector,
the first magnetic field deflector is disposed closer to the object lens than is the second magnetic field deflector, and
the first electric field deflector and the first magnetic field deflector are disposed on a same plane orthogonal to the optical axis of the beam.

13. The charged particle beam apparatus according to claim 1, wherein
the first electric field deflector is disposed closer to the objective lens than is the second electric field deflector,
the first magnetic field deflector is disposed closer to the objective lens than is the second magnetic field deflector, and
the second electric field deflector and the first magnetic field deflector are disposed on a same plane orthogonal to the optical axis of the beam.

14. The charged particle beam apparatus according to claim 1, wherein
at least one of the first electric field deflector and the second electric field deflector deflects secondary electrons obtained by irradiating the sample with the beam.

15. The charged particle beam apparatus according to claim 1, wherein
at least one of the first magnetic field deflector and the second magnetic field deflector adjusts the optical axis of the beam to an ideal optical axis of the objective lens.

16. A method of deflecting a beam in a charged particle beam apparatus,
the charged particle beam apparatus including
a charged particle beam source configured to emit a beam,
a scanning deflector configured to perform scanning with the beam emitted from the charged particle beam source,
a focusing lens configured to focus the beam,
an objective lens configured to focus the beam on a sample,
a first electric field deflector,
a second electric field deflector,
a first magnetic field deflector,
a second magnetic field deflector,
a detector configured to detect secondary electrons emitted from the sample irradiated with the beam, and a computer system configured to control deflection of the beam caused by the first electric field deflector, deflection of the beam caused by the second electric field deflector, deflection of the beam caused by the first magnetic field deflector, and deflection of the beam caused by the second magnetic field deflector, and in the charged particle beam apparatus, at least one of the first electric field deflector and the second electric field deflector is disposed on a plane different from a plane orthogonal to an optical axis of the beam on which the first magnetic field deflector and the second magnetic field deflector are disposed, the method comprising:

an adjustment step of adjusting the optical axis of the beam to an ideal optical axis of the objective lens;

a first electric field deflection step of deflecting the beam by the first electric field deflector;

a second electric field deflection step of deflecting the beam by the second electric field deflector, and moving a first deflection fulcrum, which is an intersection of the beam before deflection and the beam deflected by the first electric field deflector and the second electric field deflector, to an object point of the objective lens;

a first magnetic field deflection step of deflecting the beam by the first magnetic field deflector;

a second magnetic field deflection step of deflecting the beam by the second magnetic field deflector, and moving a second deflection fulcrum, which is an intersection of the beam before deflection and the beam deflected by the first magnetic field deflector and the second magnetic field deflector, to the object point of the objective lens; and a third magnetic field deflection step of deflecting the beam by the first magnetic field deflector and the second magnetic field deflector, at a ratio of a deflection intensity of the beam by the first magnetic field deflector to a deflection intensity of the beam by the second magnetic field deflector when the second deflection fulcrum is moved to the object point of the objective lens in the second magnetic field deflection step in a state where the first deflection fulcrum is moved to the object point of the objective lens in the second electric field deflection step;

wherein the first electric field deflector is disposed closer to the objective lens than is the detector, and the second electric field deflector, the first magnetic field deflector, and the second magnetic field deflector are disposed closer to the charged particle beam source than is the detector.

17. The method of deflecting a beam in a charged particle beam apparatus according to claim 16, wherein the second electric field deflection step is a step of canceling out the deflection of the beam caused in the first electric field deflection step, and the second magnetic field deflection step is a step of canceling out the deflection of the beam caused in the first magnetic field deflection step.

18. The method of deflecting a beam in a charged particle beam apparatus according to claim 16, further comprising:

a setting step of setting a deflection intensity of the beam by the first electric field deflector, a deflection intensity of the beam by the second electric field deflector, a deflection intensity of the beam by the first magnetic field deflector, and a deflection intensity of the beam by the second magnetic field deflector in a different optical condition, based on a deflection intensity of the beam by the first electric field deflector and a deflection intensity of the beam by the second electric field deflector when the first deflection fulcrum is moved to the object point of the objective lens in the second electric field deflection step and based on a deflection intensity of the beam by the first magnetic field deflector and a deflection intensity of the beam by the second magnetic field deflector when the beam is deflected in the third magnetic field deflection step.

19. The method of deflecting a beam in a charged particle beam apparatus according to claim 16, further comprising:

a deflection step of deflecting, by at least one of the first electric field deflector and the second electric field deflector, secondary electrons obtained by irradiating the sample with the beam.

* * * * *